United States Patent [19]
O'Donnell, Jr. et al.

[11] Patent Number: 5,483,689
[45] Date of Patent: Jan. 9, 1996

[54] RADIO RECEIVING WITH MICROPROCESSOR CONTROL

[75] Inventors: John J. O'Donnell, Jr., Marlborough; Joseph A. Killough, Brookline; William A. Allen, Weymouth, all of Mass.

[73] Assignee: Bose Corporation, Framingham, Mass.

[21] Appl. No.: 60,213

[22] Filed: May 7, 1993

[51] Int. Cl.⁶ .................................................. H04B 1/16
[52] U.S. Cl. .................... 455/200.1; 455/186.1; 455/231; 455/158.4; 455/154.1; 345/207
[58] Field of Search ........................... 455/181.1, 186.1, 455/344, 150.1, 154.1, 154.2, 200.1, 231, 158.4, 194.1, 194.2, 345, 346, 267, 233.1; 368/10, 262, 263; 345/102, 104, 75, 207; 381/107, 104

[56] References Cited

U.S. PATENT DOCUMENTS

| | | | |
|---|---|---|---|
| 3,931,621 | 1/1976 | Rose | 455/231 |
| 3,960,798 | 8/1976 | Pomerantz et al. | 455/231 |
| 4,135,158 | 1/1979 | Parmet | 455/345 |
| 4,198,603 | 4/1980 | Aldridge et al. | 455/249.1 |
| 4,405,836 | 9/1983 | Meyerhoff | 455/233.1 |
| 4,426,157 | 1/1984 | Jetter | 368/262 |
| 4,495,652 | 1/1985 | Leslie | 455/200.1 |
| 4,501,013 | 2/1985 | Sato | 455/345 |
| 4,661,994 | 4/1987 | Tanaka et al. | 455/200.1 |
| 4,760,389 | 7/1988 | Aoki et al. | 345/102 |
| 4,888,815 | 12/1989 | Ahlemeyer et al. | 455/194.1 |
| 4,969,209 | 11/1990 | Schwob | 455/181.1 |
| 5,054,071 | 10/1991 | Bacon | 455/4.1 |

FOREIGN PATENT DOCUMENTS

| | | | |
|---|---|---|---|
| 0405541A2 | 2/1991 | European Pat. Off. | |
| 0021731 | 1/1990 | Japan | 455/234.1 |
| 2259204 | 3/1993 | United Kingdom | |

OTHER PUBLICATIONS

European Patent Office Communication dated Aug. 26, 1994, Annex, Search report.

*Primary Examiner*—Reinhard J. Eisenzopf
*Assistant Examiner*—Doris To
*Attorney, Agent, or Firm*—Fish & Richardson

[57] ABSTRACT

A radio receiver has a radio tuner having a radio frequency input and an audio output, and an audio signal amplifying system having an audio input and an electroacoustical transducing output. A volume controller is coupled to the radio tuner and the audio amplifying system. A microprocessor is coupled to the tuner, volume controller, a visible display and an array of controls. The microprocessor is constructed and arranged to respond to actuation of the controls to cause the tuner to be tuned to a selected radio frequency, cause the display to display the frequency to which said radio tuner is tuned, cause the volume controller to set the sound level from the electroacoustical transducing output and cause the display to display a quantity representative of the volume to which the volume controller is then set and further constructed and arranged to respond to actuation of the controls to selectively couple the radio tuner audio output to the audio input while initially setting the sound level to zero when the signal on the audio output coupled to the audio input begins and gradually increasing the sound level to a predetermined value and reducing the sound level to zero when the signal on the audio output then coupled to the audio input ends.

10 Claims, 21 Drawing Sheets

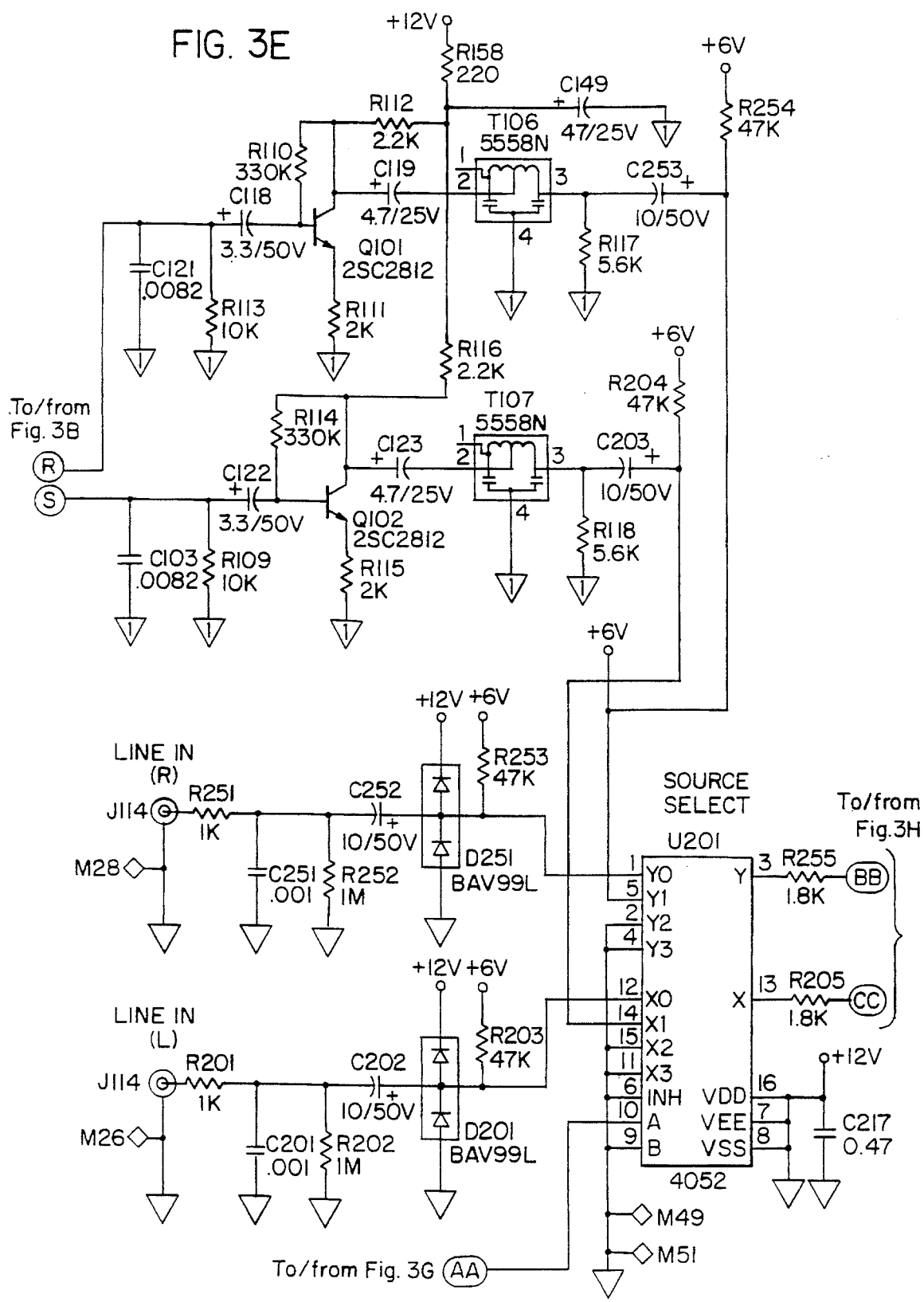

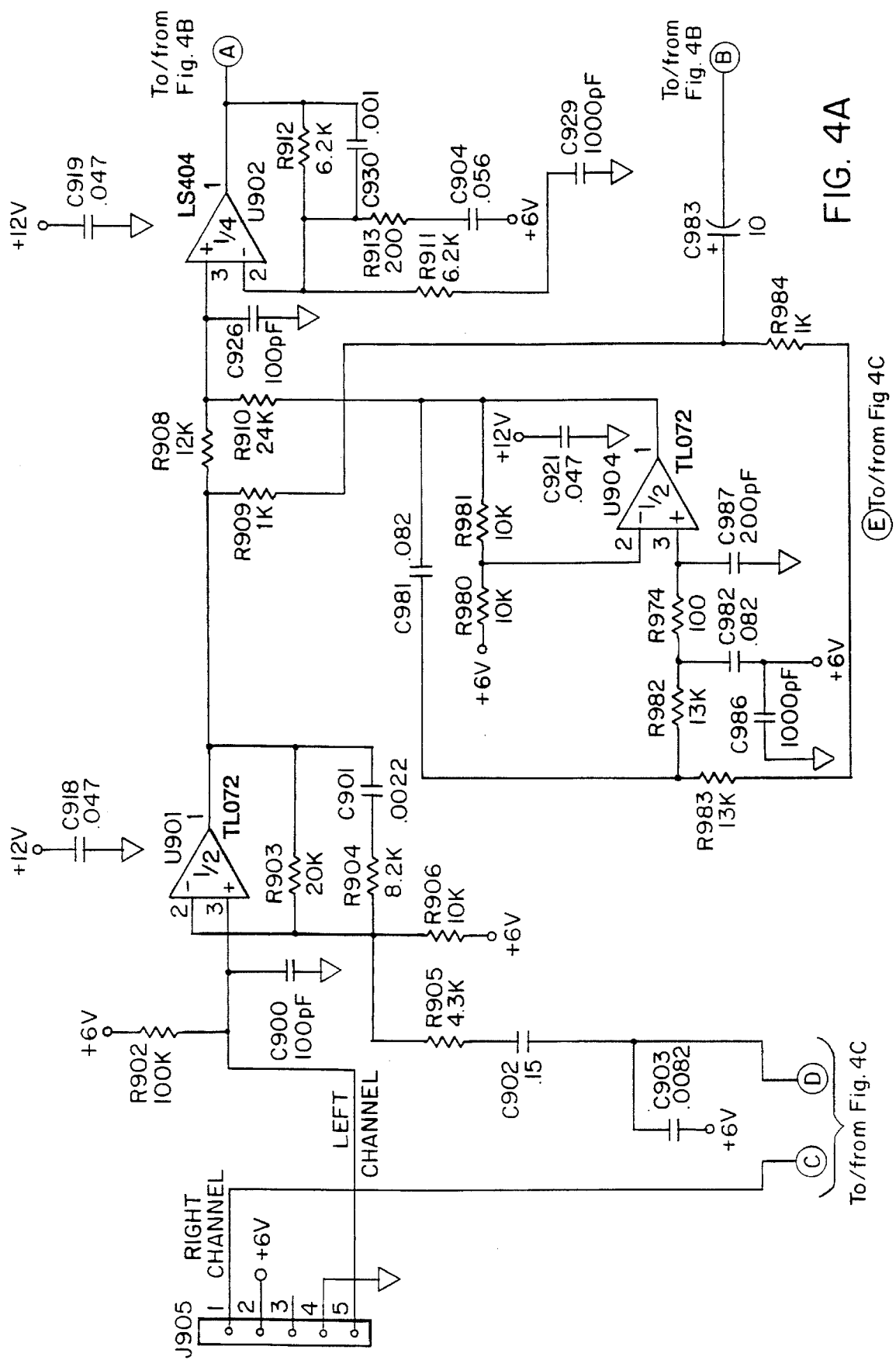

RADIO RECEIVING WITH MICROPROCESSOR CONTROL

The present invention relates in general to radio receiving and more particularly concerns a novel alarm clock stereo radio receiver characterized by a number of advantageous features.

According to the invention, there is a radio receiver having a tuner tunable to a station frequency, typically an AM/FM tuner, a microprocessor coupled to the tuner, a volume controller and a visual display that displays decimal numbers in a common set of digit locations representative of only one of station frequency, volume level and time during mutually exclusive time intervals. A plurality of manually operated controls are coupled to the microprocessor. The receiver also has an audio amplifying and electroacoustical transducing system for providing a transduced audio signal characterized by a volume level, typically coupled to the tuner and a volume controller. The audio amplifying and electroacoustical transducing system typically comprises a stereo amplification system with a first full range channel and a second upper frequency channel, typically left and right channels, respectively. The first channel has full range equalization circuitry and a full range driver. The second channel has upper frequency equalization circuitry and an upper frequency driver. There is preferably dynamic bass equalization and compressor circuitry constructed and arranged to detect the beginning of overload and reduce gain to prevent audible distortion. The microprocessor is also coupled to a mute drive that is coupled to power amplifiers in first and second channels constructed and arranged to mute the power amplifiers when switching occurs. Preferably, the microprocessor is also coupled to an infrared receiver that receives infrared control signals from a remote controller. The display preferably ordinarily displays time of day except when changes occur; for example, when the receiver turns on and off, when the selected volume changes, when the selected station changes, when setting the alarm. The invention also typically includes an alarm tone of controllable volume.

Features of the invention include ramping volumes up and down. The volume of receiver output and/or alarm tone ramps up when the alarm triggers or for normal turn-on. The ramp up is to the previous set level, the instantaneous level value being indicated on the visual display.

Another feature of the invention is adjustable preset volume level. The level to which the volume ramps may be preset with the receiver off, the selected level being indicated on the visual display.

According to another aspect of the invention, there is an auxiliary input for receiving a sound signal from another source, such as a compact disc player with an electronic source selector coupled to the microprocessor to allow selection of the tuner or auxiliary input. A feature of the invention is that when the tuner is selected, the volume controller adjusts the level, and the final selected level resides in microprocessor memory. When the auxiliary input is selected, the volume controller adjusts the volume for the signal from the auxiliary input independent of any settings in the tuner mode with the final selected level residing in memory in the microprocessor. Switching between the tuner and auxiliary switches to the last volume level set in each mode, thereby allowing for differences in sensitivity.

A feature of the invention resides in using a combination of controls to preset the dimmed brightness in response to sensing the ambient light level.

Another feature of the invention resides in a multifunction snooze and sleep control. If the alarm triggers in the receiver and/or alarm tone mode, tapping this control silences that sound for a predetermined snooze interval, typically 10 minutes. If the alarm triggers both alarm tone and receiver modes, tapping this control once silences the alarm tone for the snooze interval while leaving the receiver playing while tapping this control twice silences both for the snooze interval.

Other features, objects and advantages of the invention will become apparent from the following detailed description when read in connection with the accompanying drawings in which.

Figure 6:
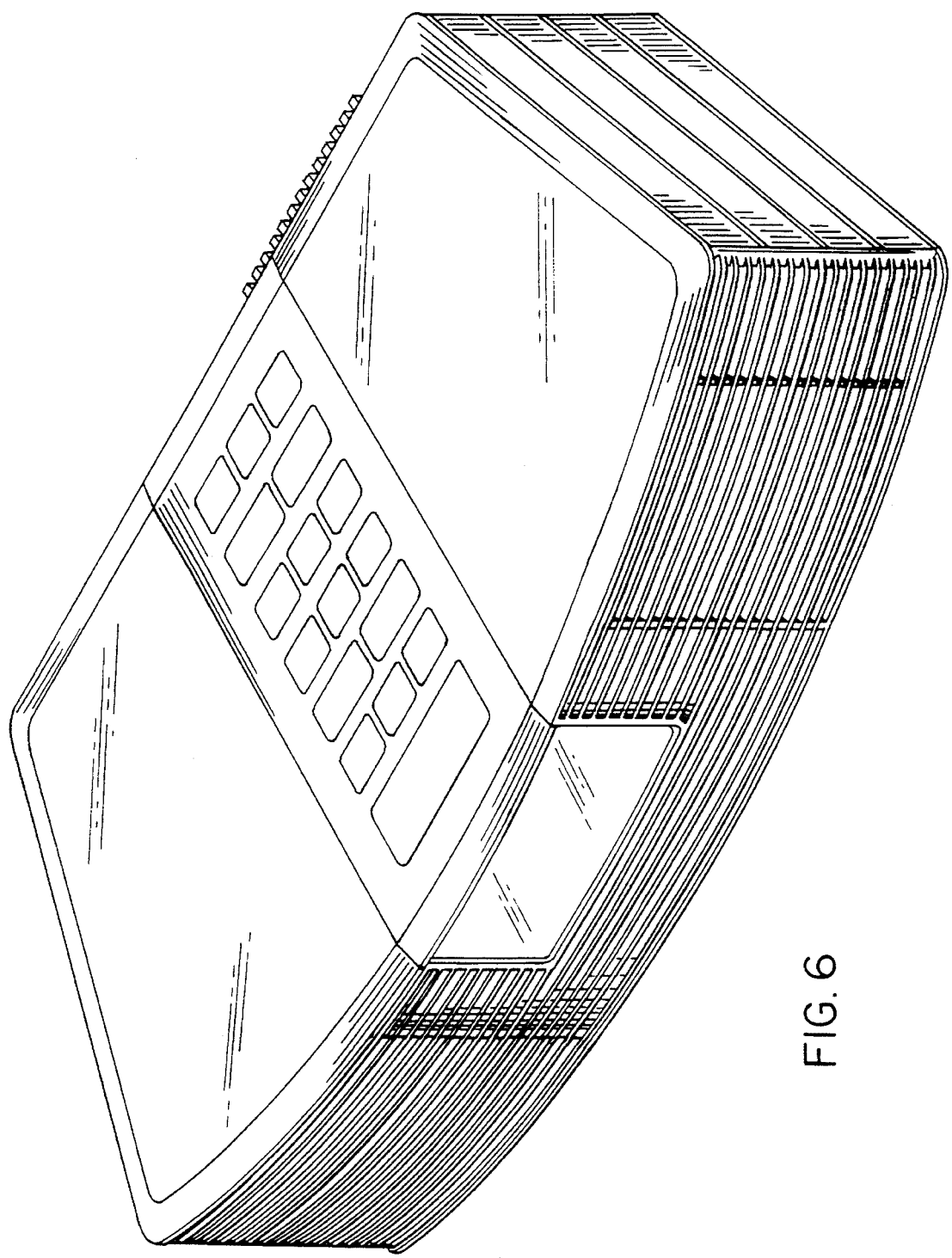

FIGS. 3A–3J form a schematic circuit diagram of the main board in an exemplary embodiment of the invention;

FIGS. 4A–4D form a schematic circuit diagram of an equalizer board in an exemplary embodiment of the invention;

FIGS. 5A–5D form a schematic circuit diagram of a display board in an exemplary embodiment of the invention; and FIG. 6 is a perspective view of a clock stereo receiver embodying the invention.

Figure 1:
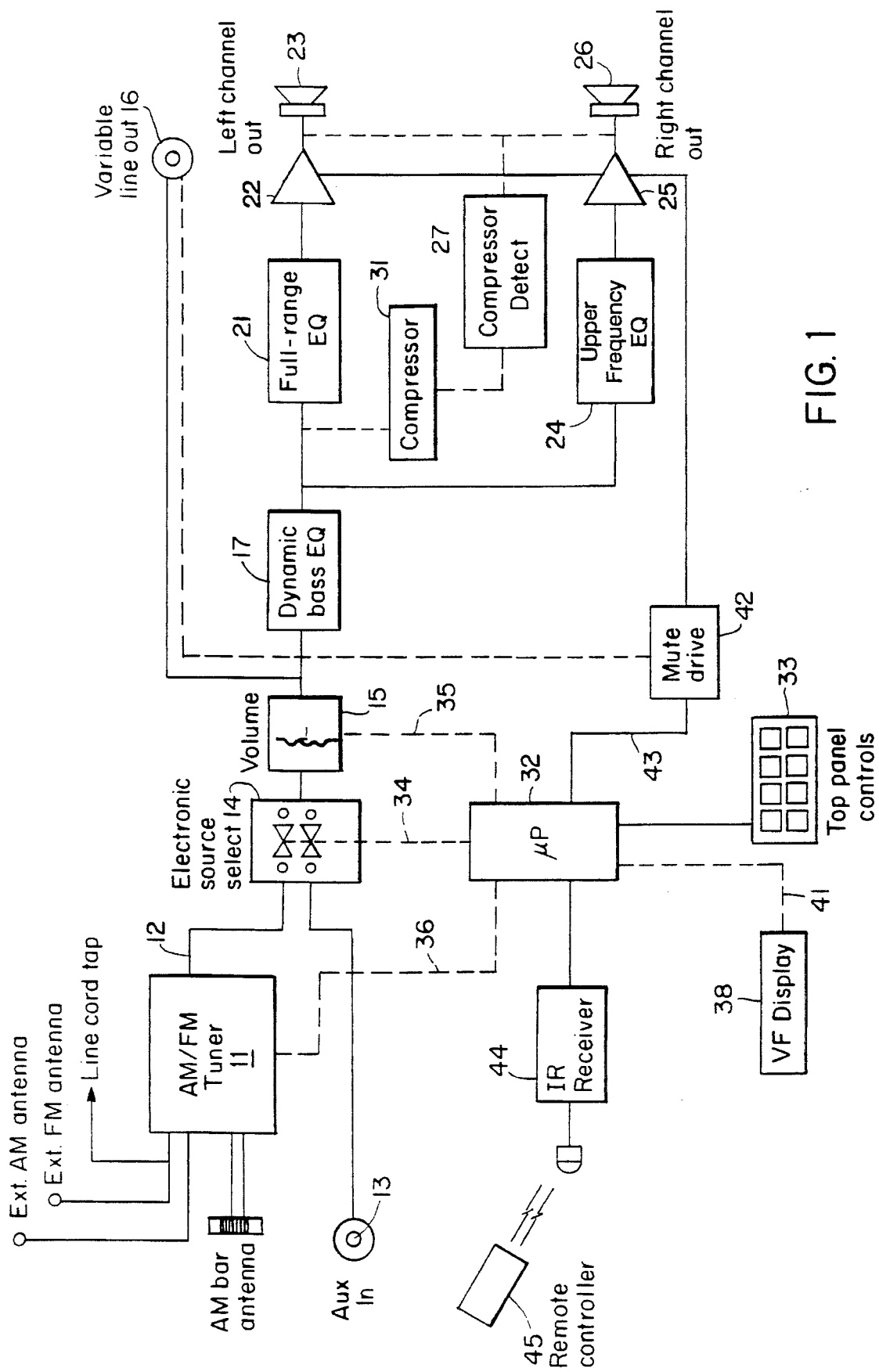
FIG. 1 is a block diagram illustrating the logical arrangement of a system according to the invention.

With reference now to the drawings and more particularly FIG. 1, there is shown a diagram illustrating the logical arrangement of an alarm clock stereo receiver according to the invention. The receiver includes an AM/FM tuner 11 that typically converts AM and FM radio frequency signals received at the indicated antenna inputs into audio signals, which may be stereo where available on output 12. An auxiliary input 13 may be coupled to an external source of audio signals, such as a compact disc player. Electronic source select switch 14 connects a selected one of these audio signals to volume controller 15. The output of volume controller 15 is coupled to variable line output 16 and to the input of dynamic bass equalization circuitry 17 that preferably embodies the principles disclosed in Bose U.S. Pat. No. 4,490,843. Full range equalization circuitry 21 in the left channel receive the full range of spectral components from dynamic bass equalization circuitry 17, including the sum of the bass spectral components present in the left and right channels and energizes left power amplifier 22 that energizes left full-range driver 23. Right upper frequency equalization circuitry 24 receives only upper frequency spectral components in the right stereo signal and energizes right power amplifier 25, which energizes right upper frequency driver 26. Compressor detect circuitry 27 detects the occurrence of overload beginning of amplifiers 22 or 25 to cause compressor 31 to attenuate the input signals to equalizer 21 and thereby prevent audible distortion.

The receiver includes microprocessor 32 that responds to signals selected by operation of top panel control switches 33 and other information signals it receives to control electronic source select switch 14 over path 34, control volume controller 15 over path 35, control AM/FM tuner 11 over control path 36, control visual display 38 over control path 41 and operate mute drive 42 over control path 43. Microprocessor 32 may also receive control signals from IR receiver 44 when remote controller 45 furnishes appropriate control signals.

Figure 2:
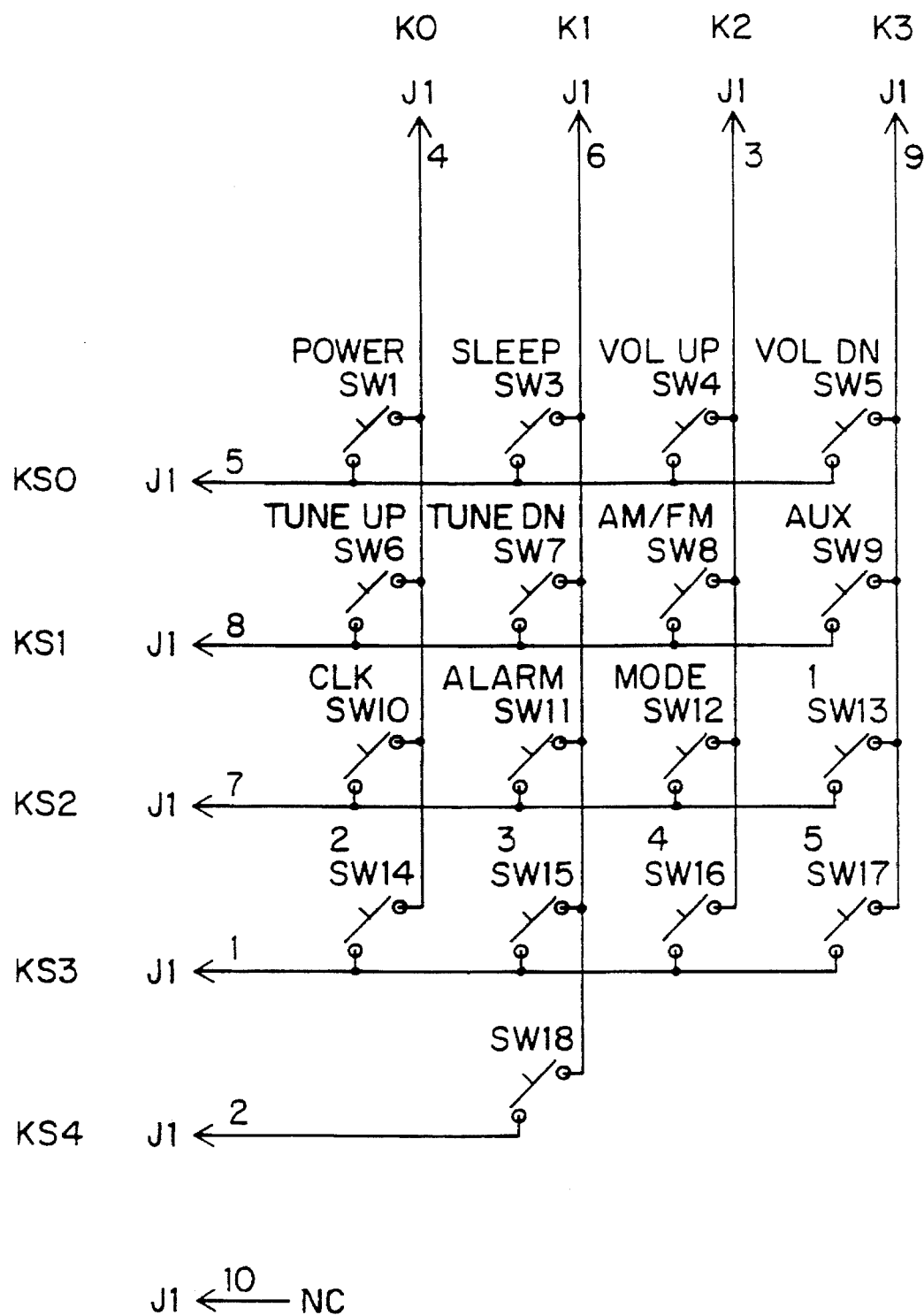
FIG. 2 is a schematic circuit diagram of an exemplary embodiment of controls comprising control switches according to the invention.
Figure 3A:
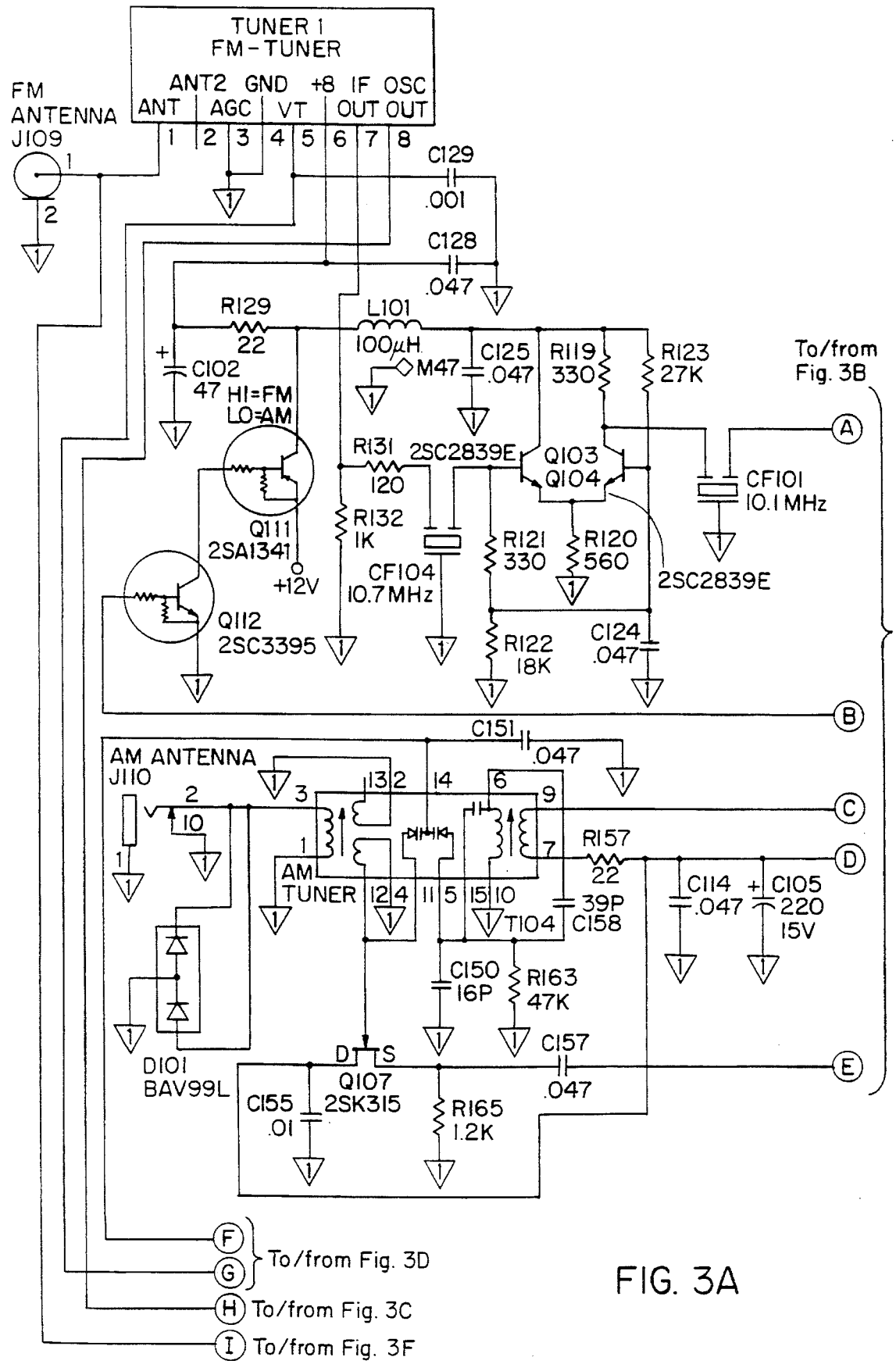
Figure 3B:
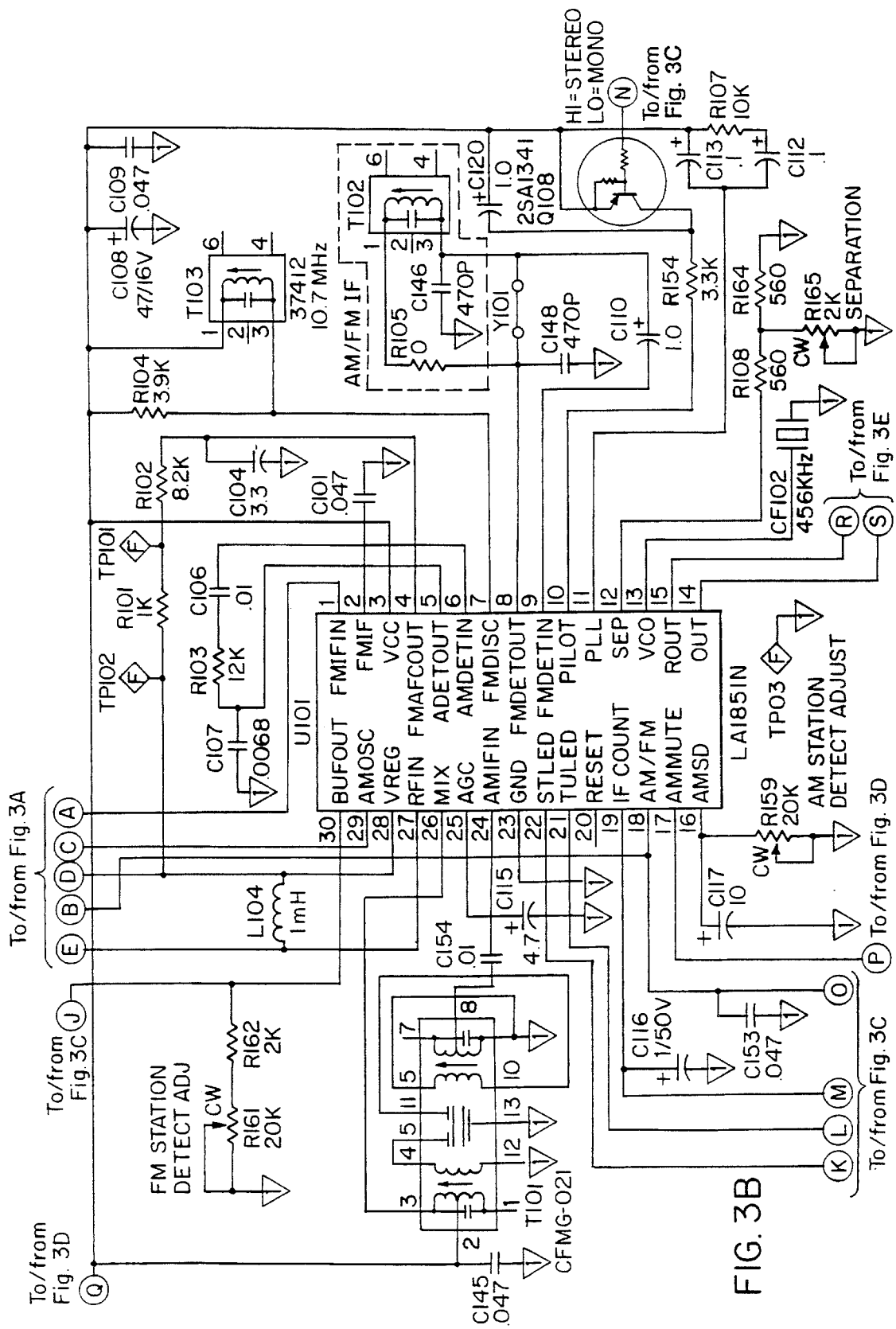
Figure 3C:
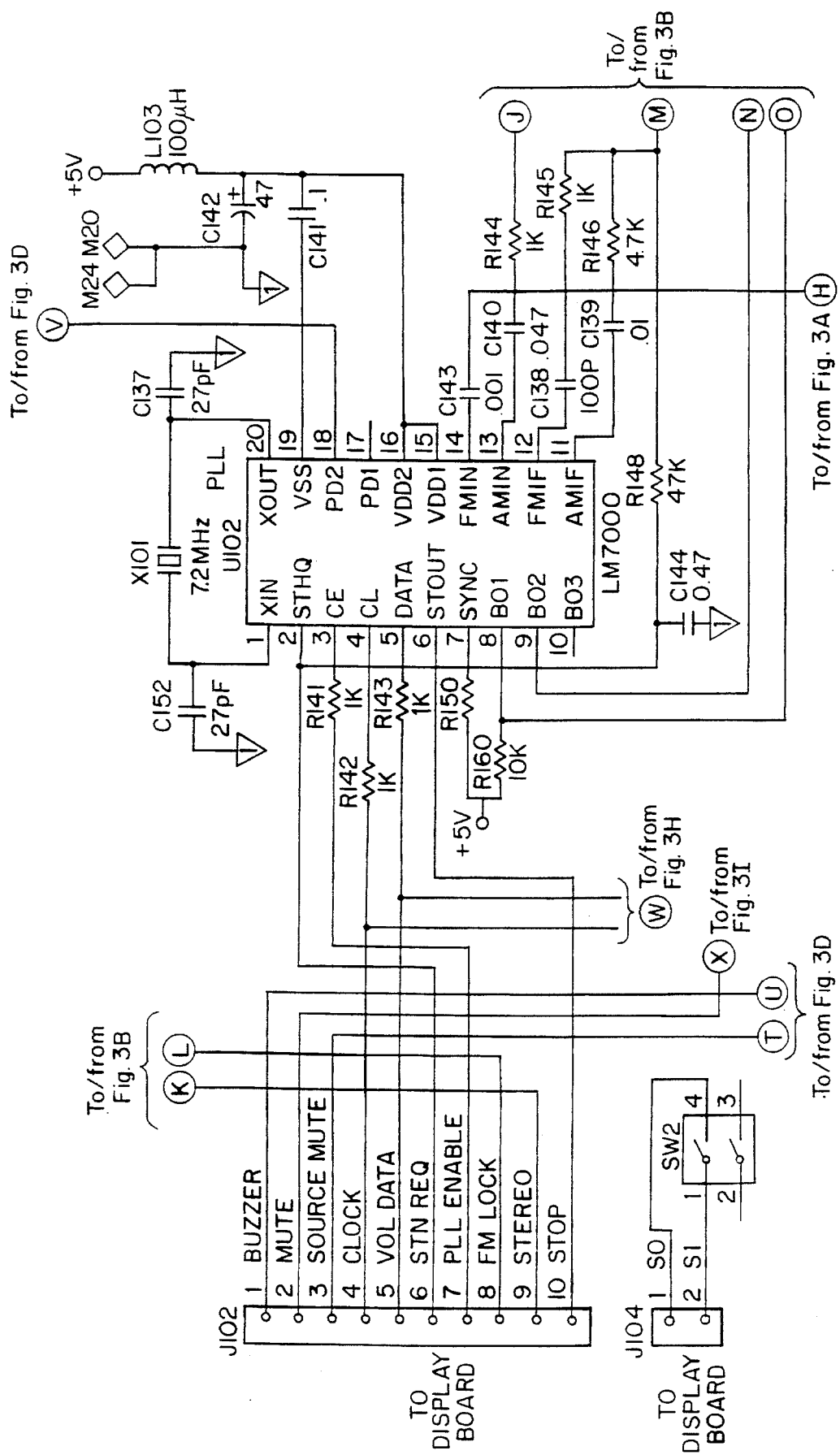
Figure 3D:
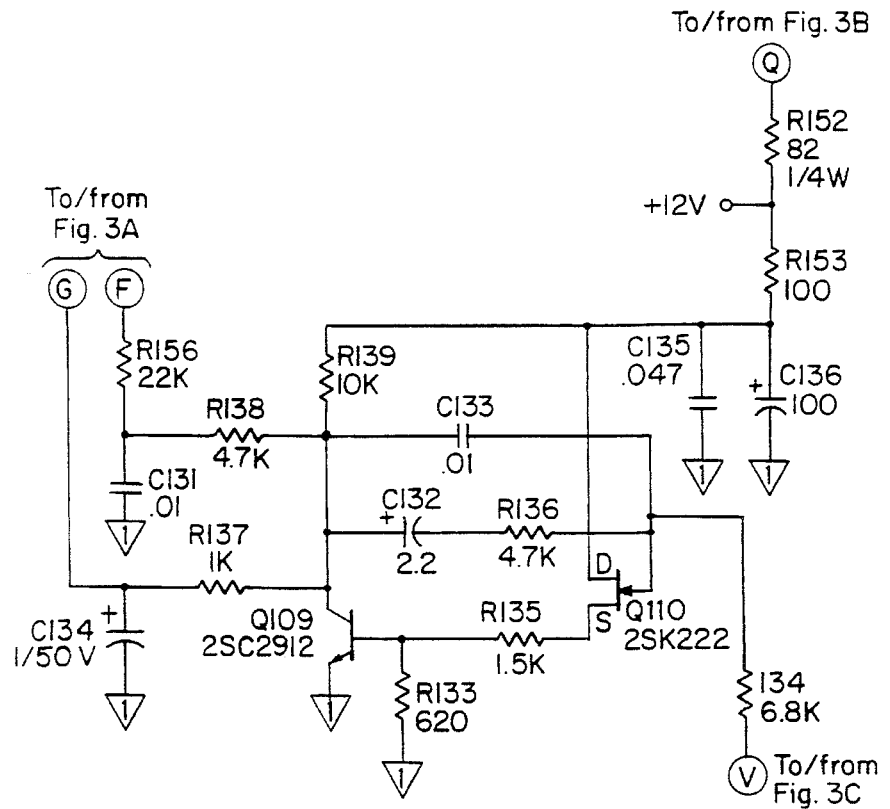
Figure 3D:
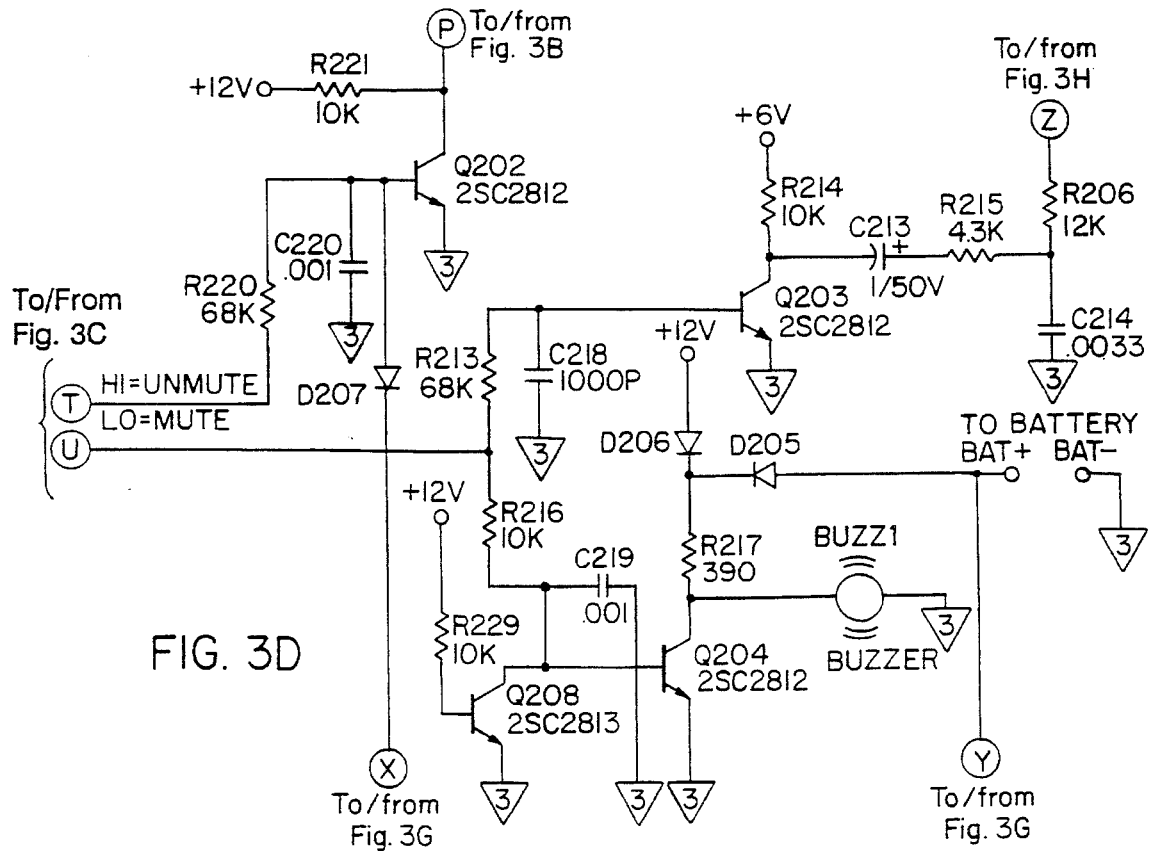
Figure 3F:
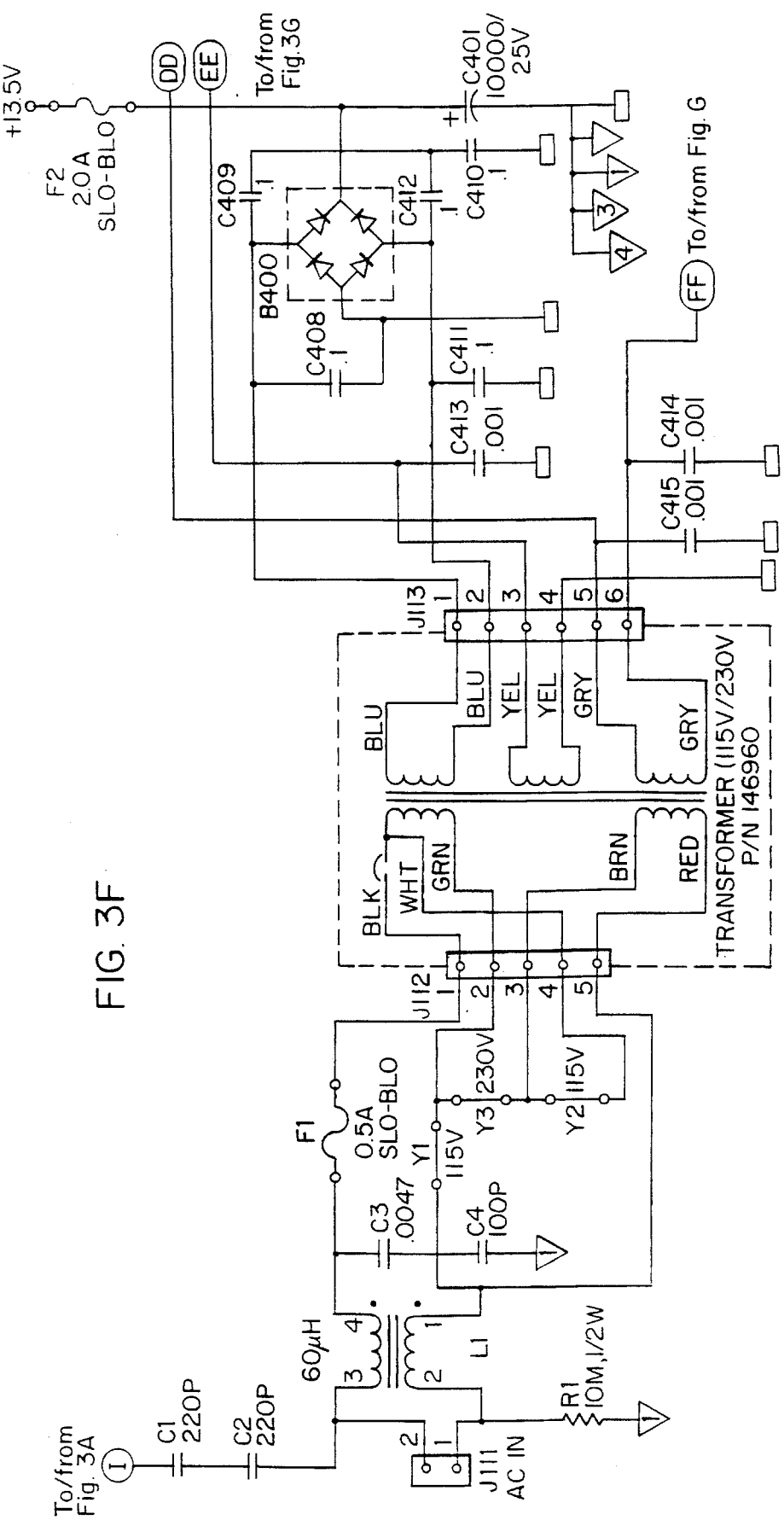
Figure 3G:
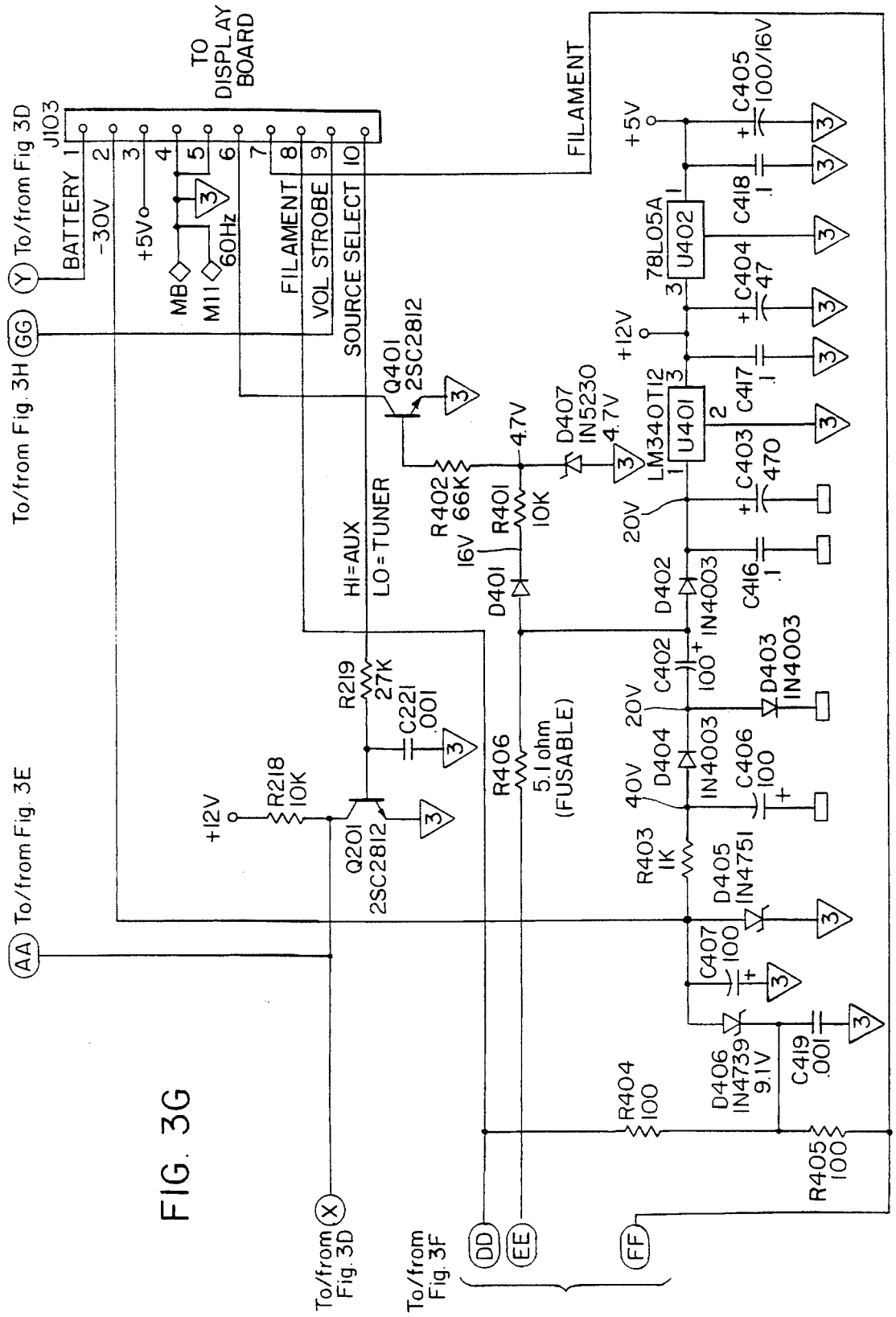
Figure 3H:
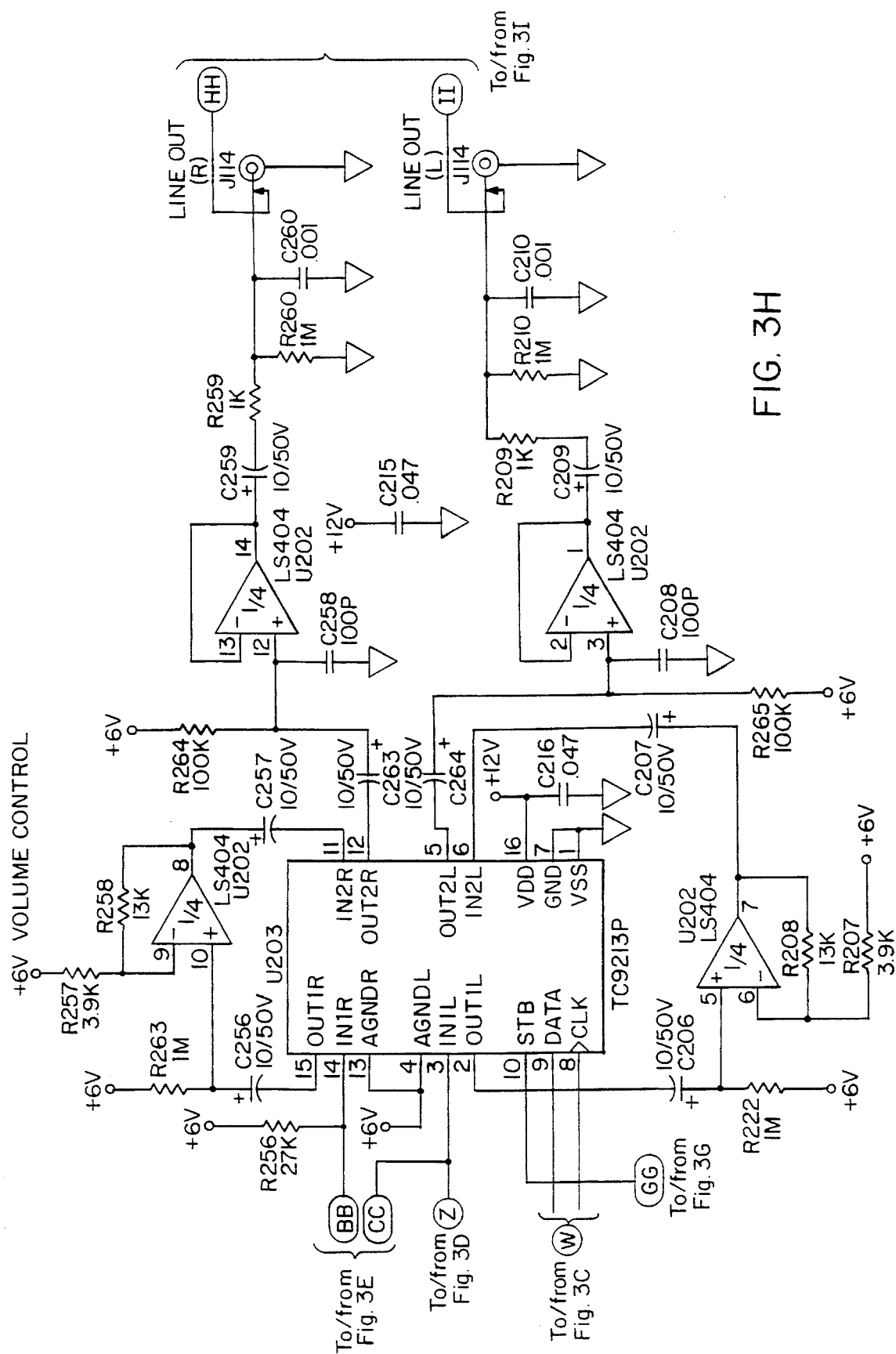
Figure 3I:
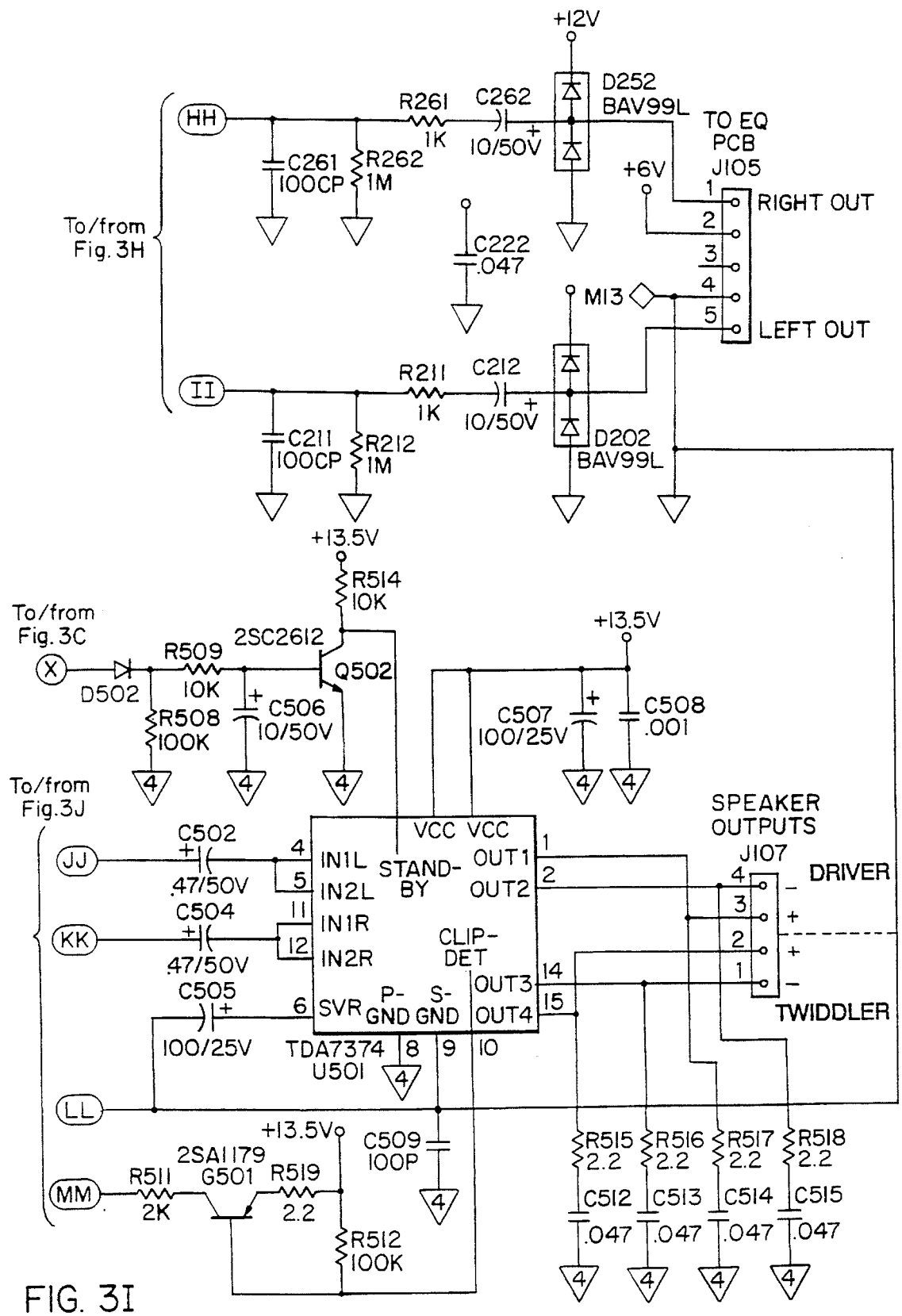
Figure 3J:
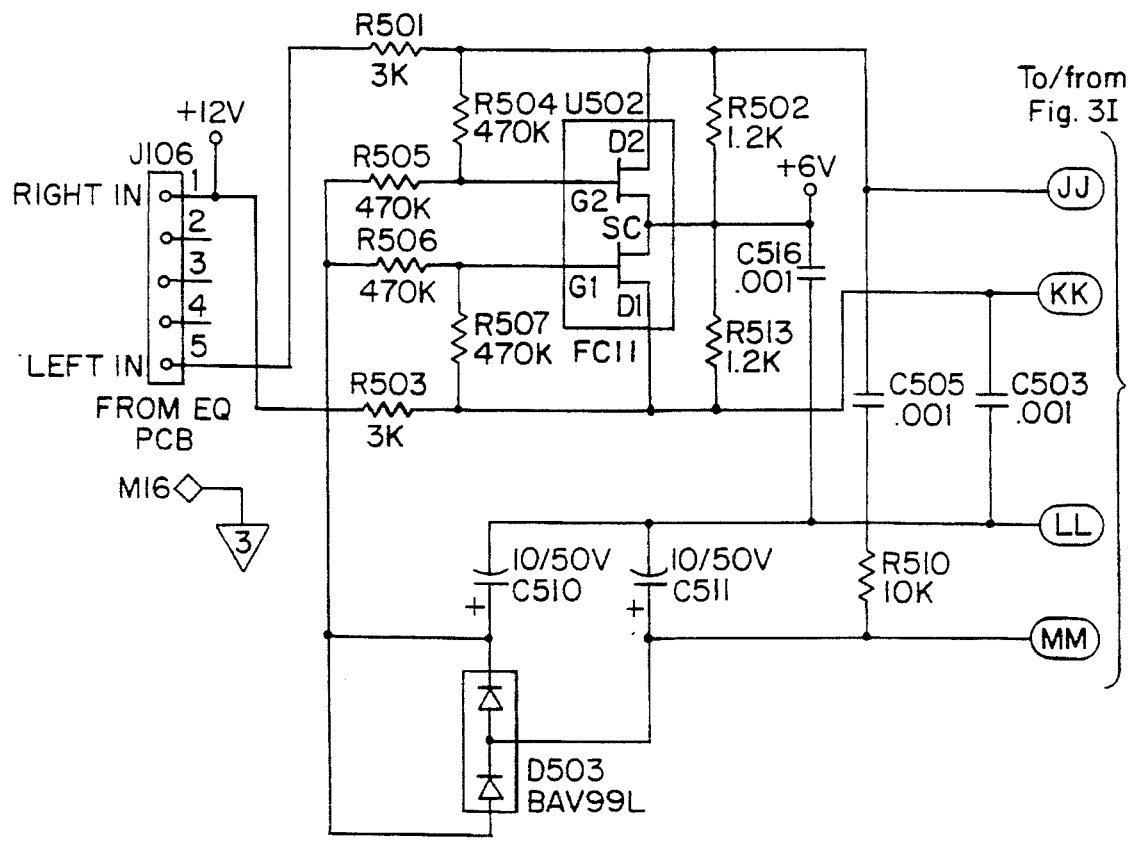
Figure 3J:
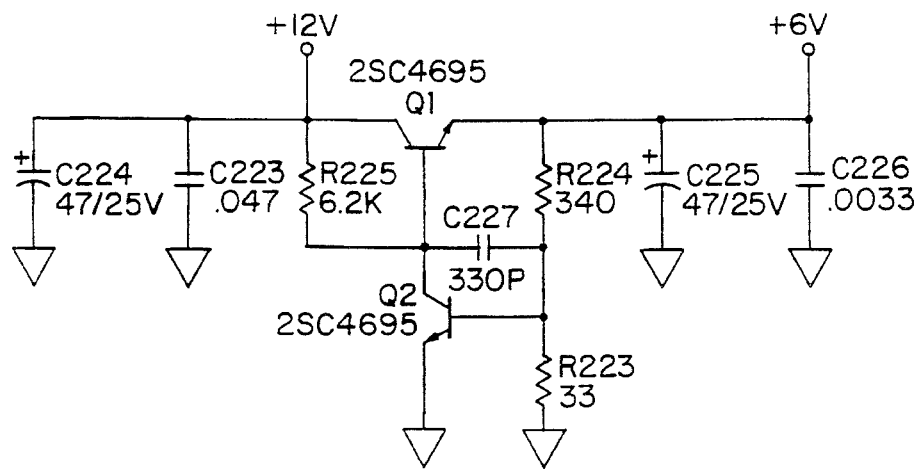
Figure 4B:
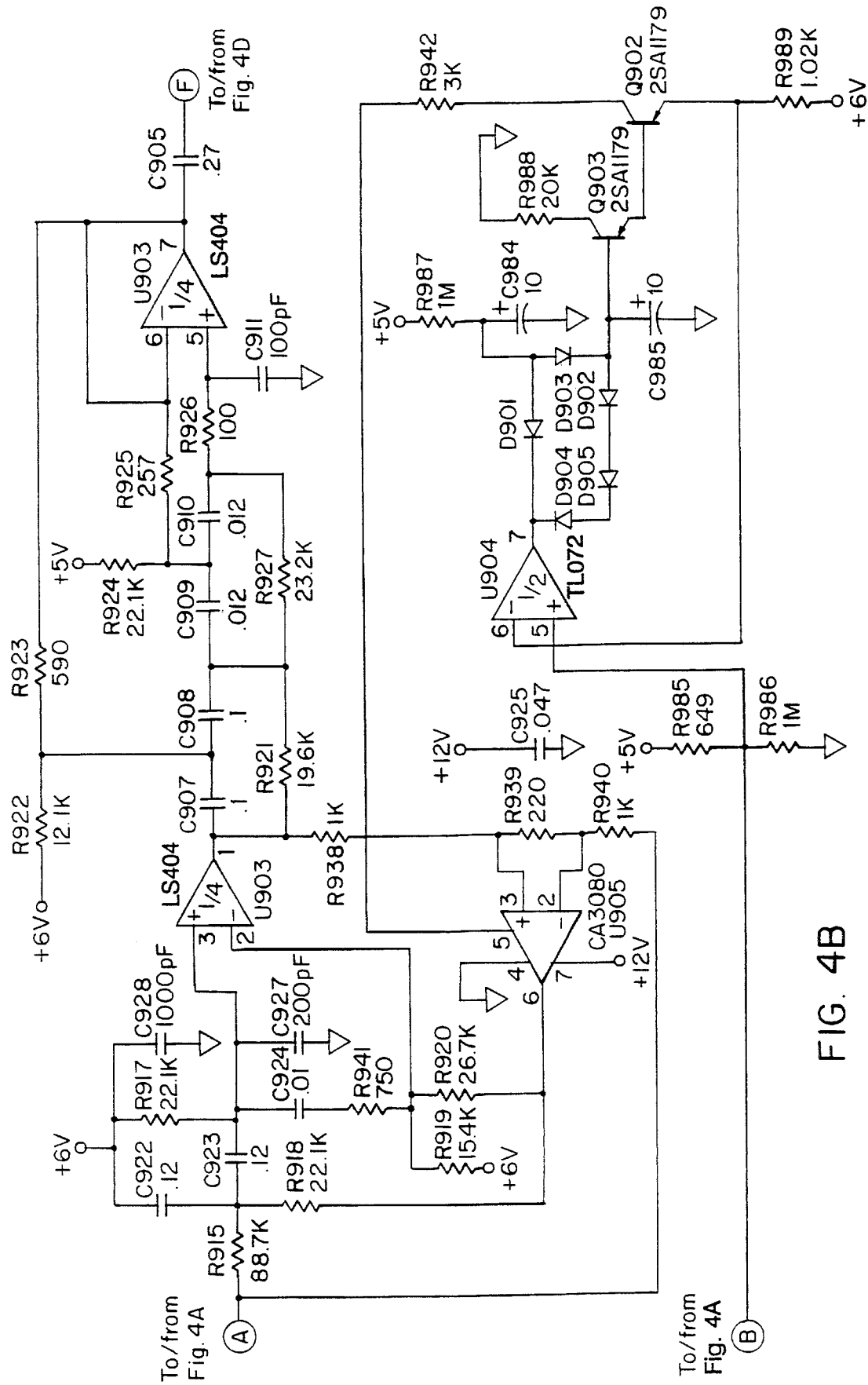
Figure 4C:
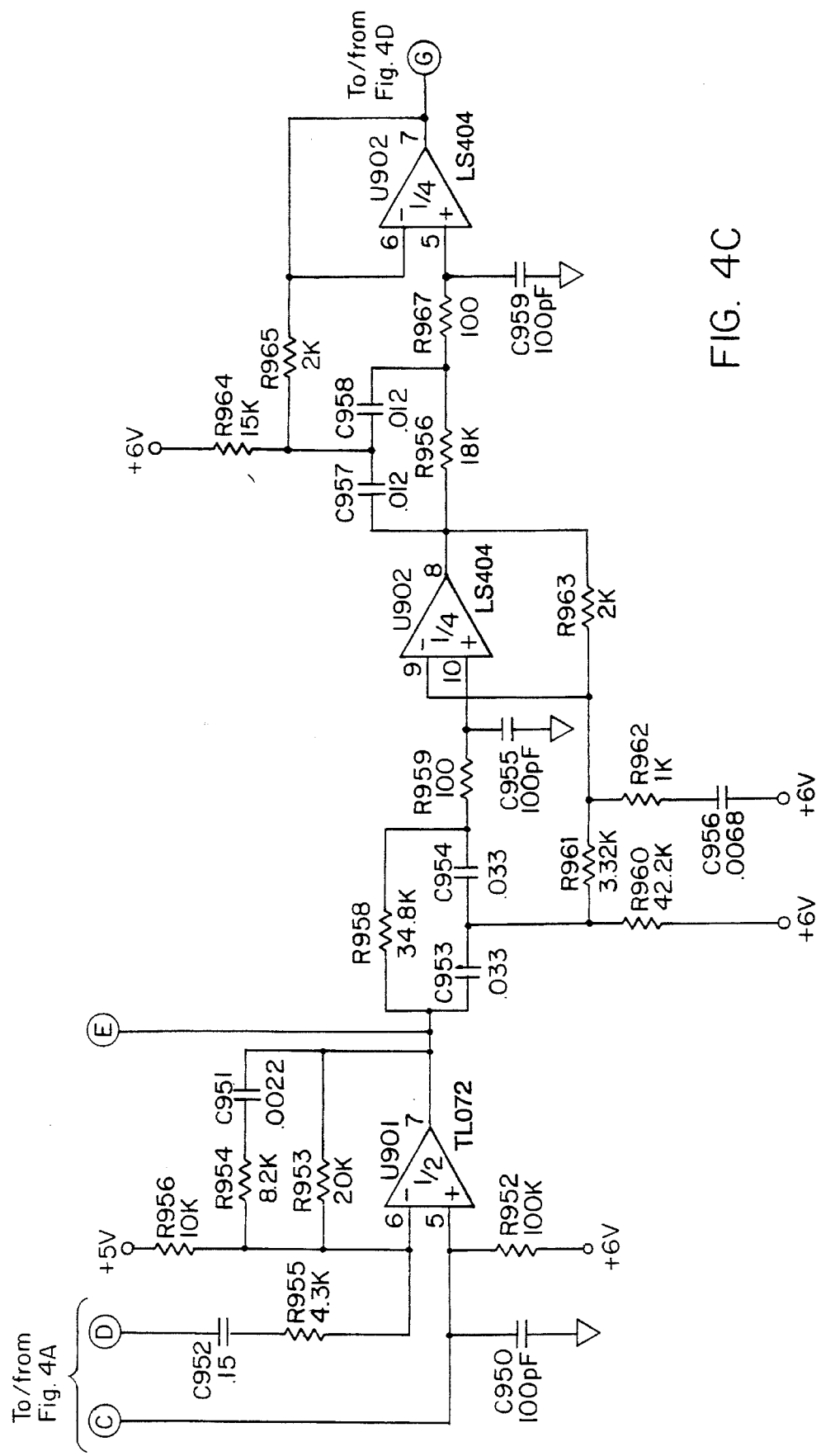
Figure 4D:
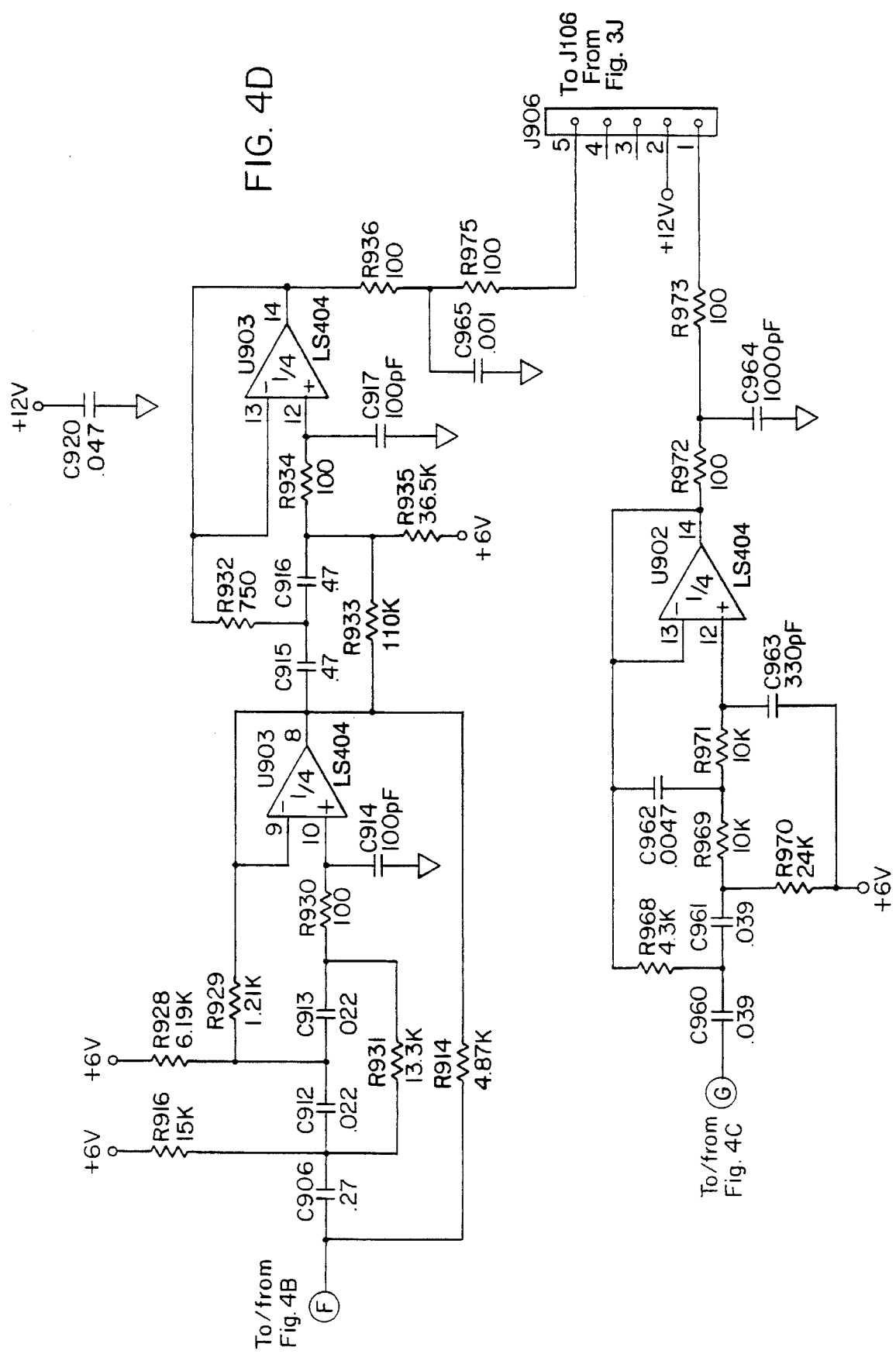
Figure 5A:
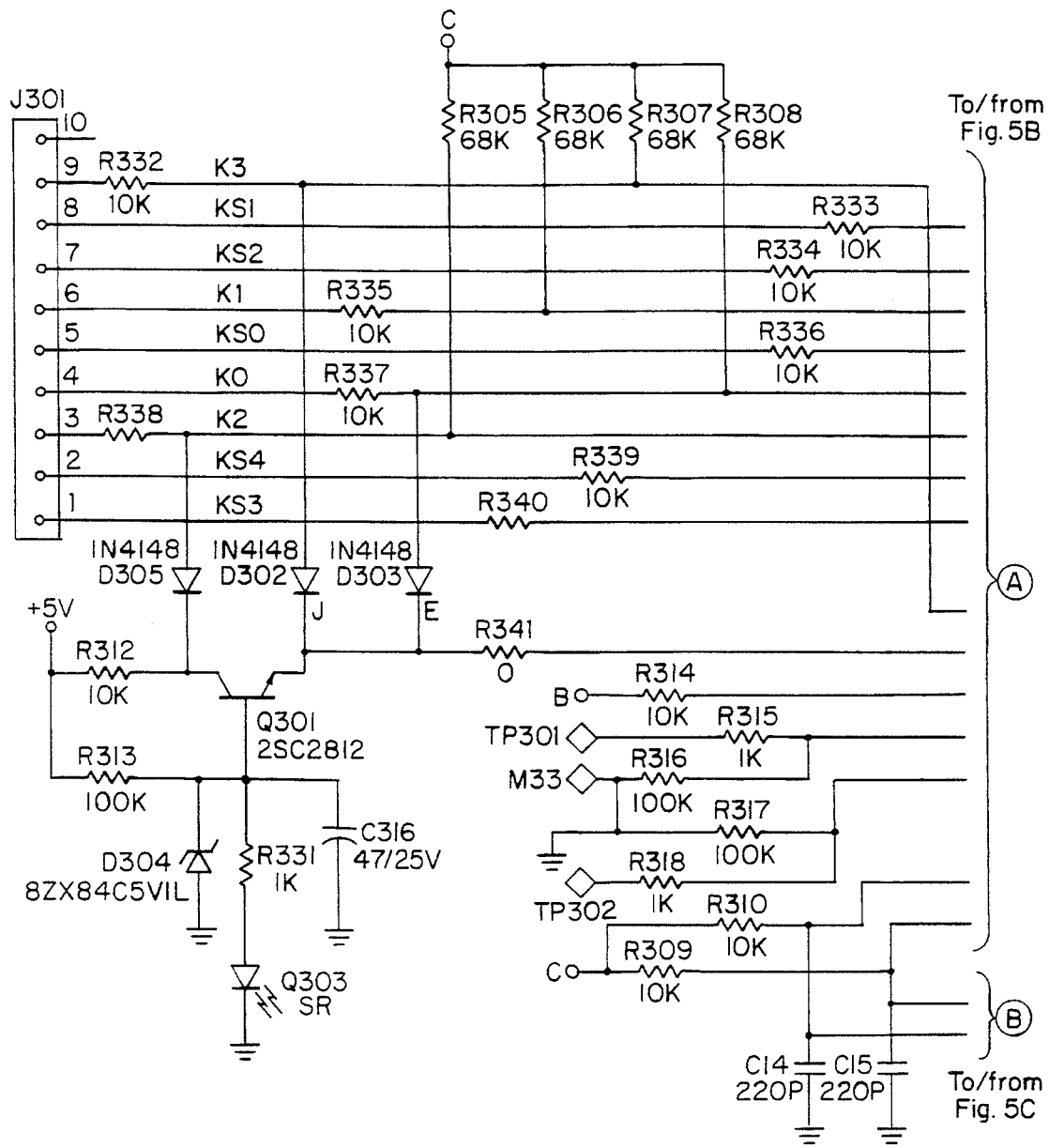
Figure 5B:
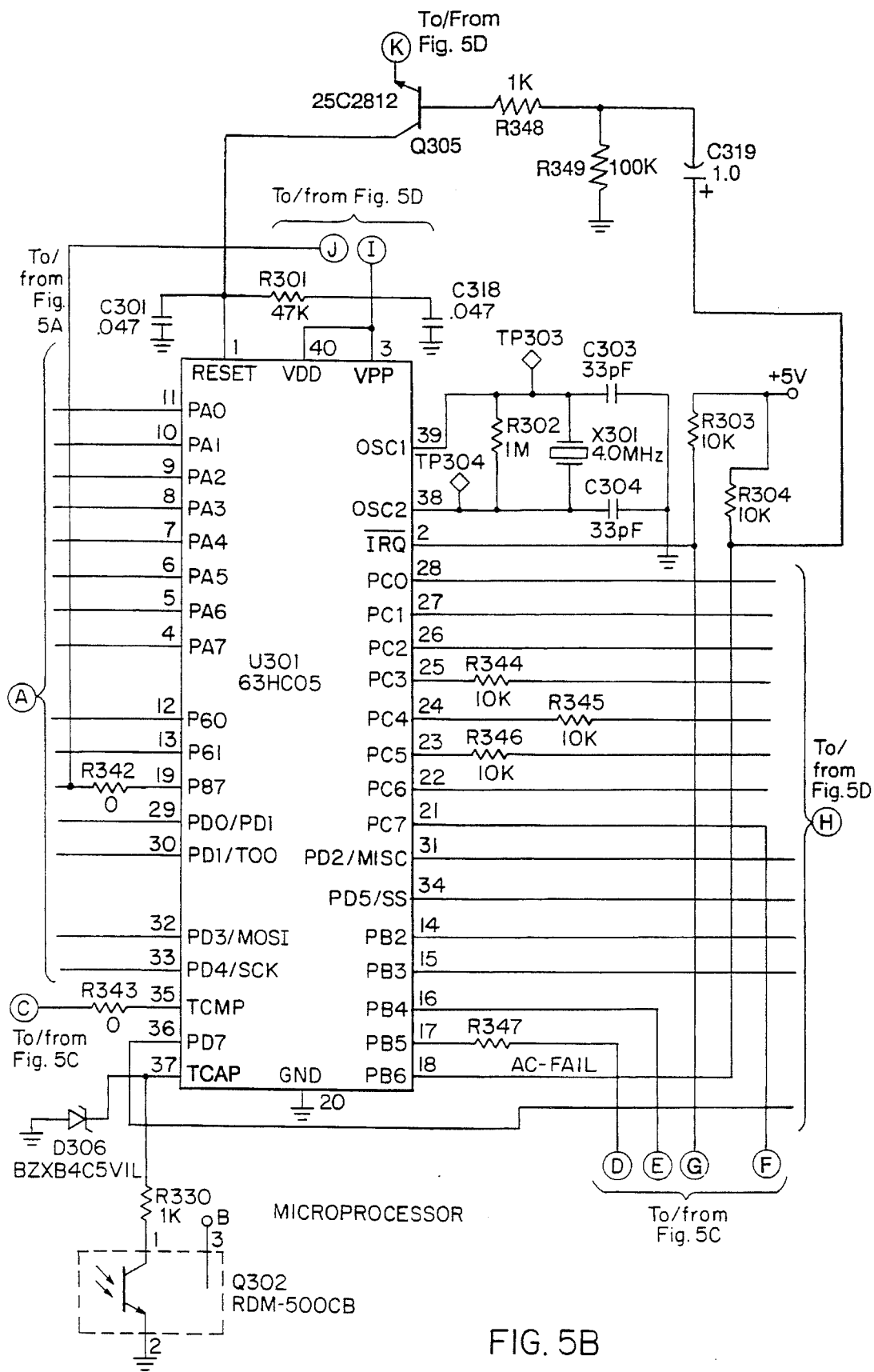
Figure 5C:
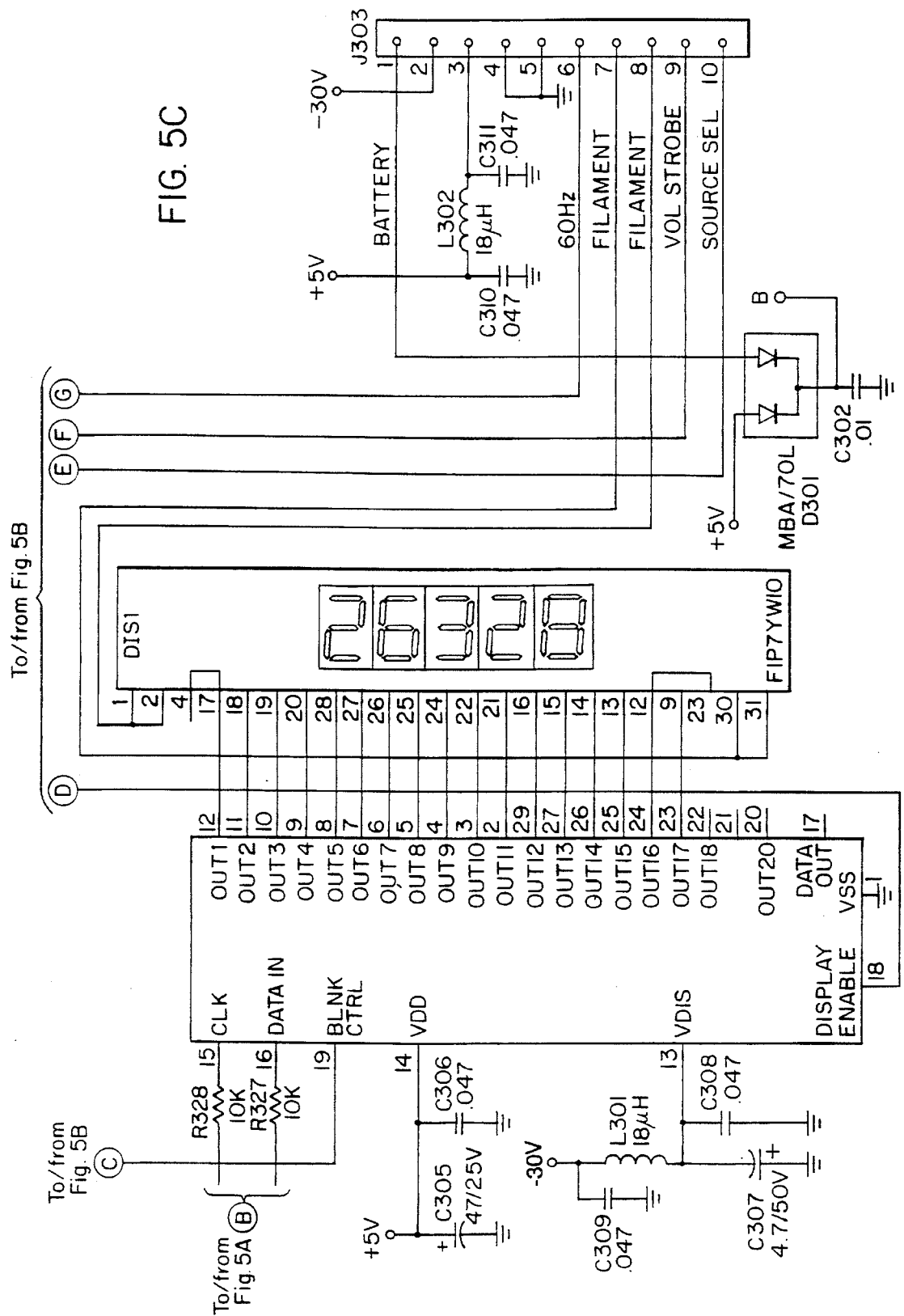
Figure 5D:
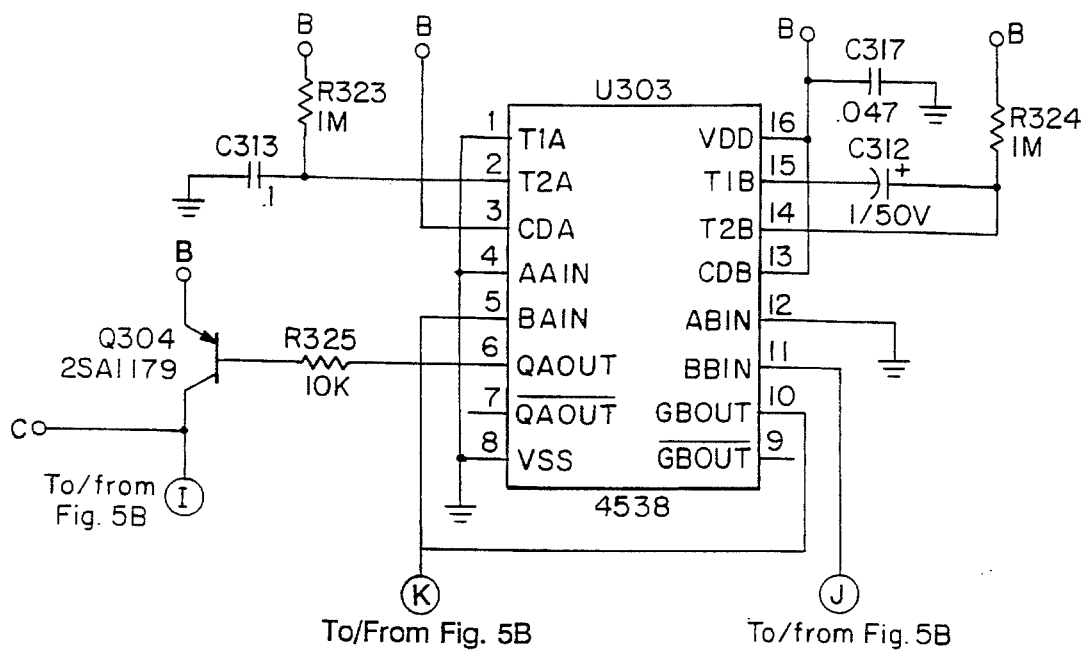
Figure 5D:
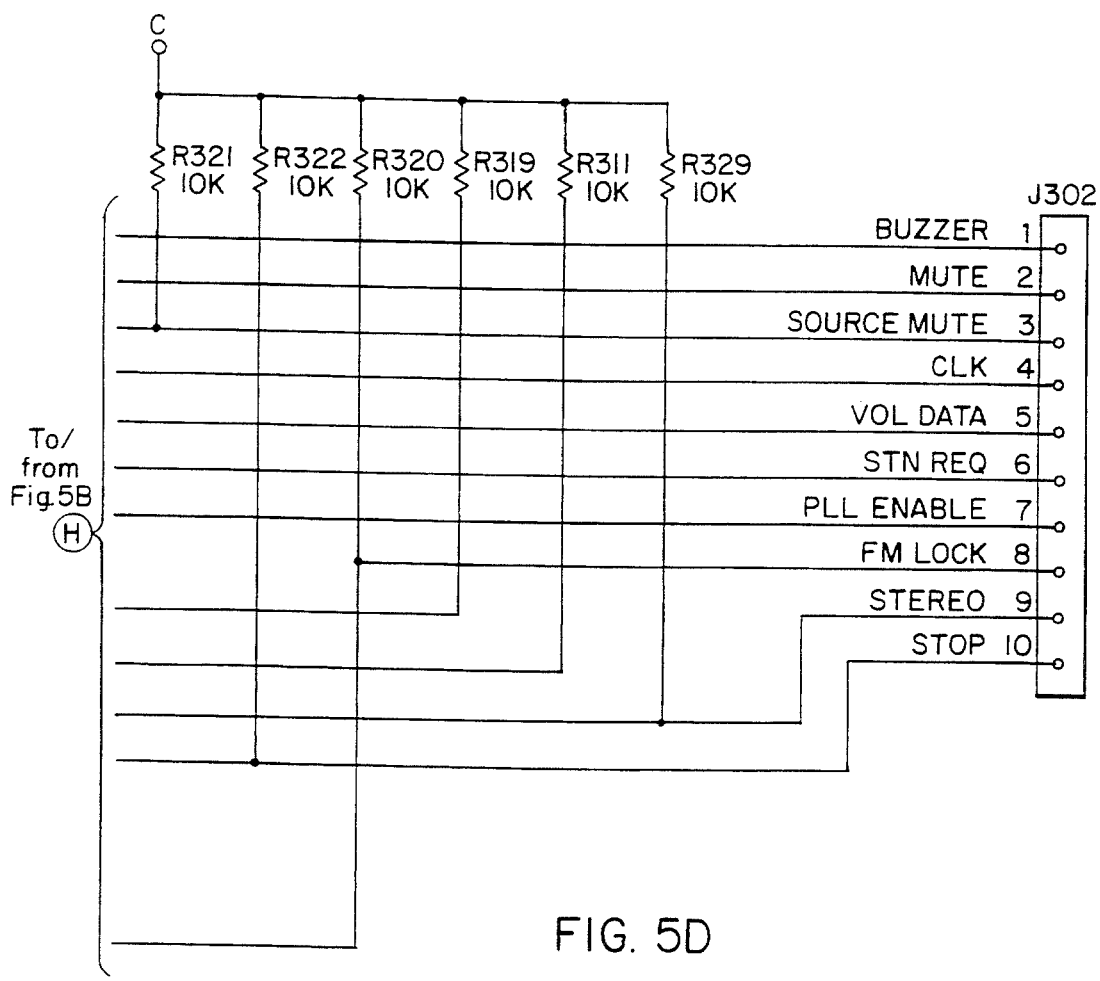

Referring to FIG. 2, there is shown a schematic circuit diagram of top panel control switches 33. Each switch is typically a single-pole normally open momentary contact switch arranged to connect levels on one of lines KS0–KS4 to one of lines K0–K3 to furnish an appropriate control signal to microprocessor 32. Switch SW1 controls on-off of the sound. Switch SW3 is the snooze/sleep switch. Switch SW4 controls volume up, and switch SW5 controls volume down. Switch SW6 controls tune up, and switch SW7 controls tune down. Switch SW8 controls switching between the AM and FM mode of tuner 11. AUX switch SW9 controls selection of the signal on auxiliary input 13. Clock switch SW10 controls enabling clock setting. Alarm switch SW11 controls the alarm state. Alarm mode switch SW12 controls the alarm mode. Switches SW13–SW18 control preselected stations 1–6, respectively, on each band. Some switches perform multiple functions. Switch functions are described in greater detail below in connection with describing operating characteristics.

Referring to FIGS. 3A–3J, there is shown a schematic circuit diagram of the main circuit board of an exemplary receiver according to the invention. Referring to FIGS. 4A–4D, there is shown a schematic circuit diagram of an equalizer board in an exemplary embodiment of the receiver according to the invention. Referring to FIGS. 5A–5D, there is shown a schematic circuit diagram of a display board in an exemplary embodiment of the receiver according to the invention. These schematic circuit diagrams include representative parameter values that enable a person skilled in the art to build an actual working model of the invention embodied substantially in the BOSE ACOUSTIC WAVE receiver commercially available shortly after the filing of this application.

The exemplary embodiment illustrated in FIGS. 2–5 has the following operating characteristics. When operation of power switch SW1 has the receiver in the off mode, display 38 indicates the current time. If alarm switch SW11 has enabled the Alarm 1 condition, radio and/or buzzer icons are/is illuminated on display 38 if appropriate mode has been set by switch SW12. If Alarm 2 is enabled, the Alarm 2 indicator, radio and/or buzzer icons are illuminated on display 38 if appropriate mode has been set by switch SW12.

Actuating power switch SW1 when the unit is off recalls the last mode (AM/FM/AUX). If the recalled mode is AM or FM, tuner 11 is selected, the tuner selects the band (AM or FM) last heard and the last station heard on this band, and the corresponding AM, FM and/or stereo indicators are illuminated on display 38. If the station is a preset, the appropriate preset indicator is illuminated on display 38. The station frequency is displayed. If AM, 3 or 4 digits (e.g., 680, 1030). If FM, 3, 4 or 5 digits with decimal (e.g., 90.9, 104.1 or 104.15). After three seconds, the current time is again displayed, the decimal if illuminated is extinguished, and the colon and AM/PM (if not in 24-hour format) indicators are illuminated on display 38. If the recalled mode is AUX, the AUX indicator is illuminated on display 38, and the current time is displayed after display of volume level. The amplifier is powered up, and the volume ramps up from silence to its previous setting at 10 units/second, in a three-second period.

When the unit is on and power switch SW1 actuated, the volume ramps down to silence at a rate of 10 units per second for first 10 volume units, then full mute. The amplifier is powered down. Any illuminated mode, station or preset indicators are extinguished while any illuminated alarm icon remains on in display 38, and the current time continues to be displayed. If the alarm is sounding, operating switch SW1 mutes the alarm, the alarm mode remains unchanged and the current time continues to be displayed.

Auxiliary switch SW9 functions as a duplicate of power switch SW1 when the unit is off, selects auxiliary input 13 as the source and illuminates the AUX indicator on display 38. In addition, when the alarm is sounding, actuating switch SW9 mutes the alarm, selects the source at auxiliary input 13 while the alarm mode remains unchanged.

AM/FM switch SW8 also acts as a duplicate of power switch SW1 when the unit is off, and selects the tuner with the last station heard. The band is not toggled to the other band. If the unit is in the auxiliary mode, depressing AM/FM switch SW8 selects the tuner as the source, display 38 displays the station frequency for three seconds, the band (AM or FM) last heard is selected and tuned to the last station heard on this band. If this station is a preset, the appropriate preset indicator is illuminated on display 38. It is convenient to refer to the tuner and audio amplifying and electroacoustical transducing system as the radio, which is on when reproducing sounds modulated on radio frequency carriers to which the tuner is tuned.

A momentary press or press-and-hold of AM/FM switch SW8 toggles the tuner from one band to the other, displays the station then tuned on display 38 during hold down and for three additional seconds after AM/FM switch SW8 is released. Then current time is displayed on display 38. If the alarm buzzer is sounding, pressing AM/FM switch SW8 silences the buzzer, acknowledges the alarm by disabling the time-out and selects the tuner while the alarm mode remains unchanged. If the alarm radio is playing, pressing AM/FM selector switch SW8 acknowledges the alarm by disabling the time-out and displays the station frequency for three seconds. The unit is then on at the volume level at which AM/FM switch SW8 was depressed; i.e., if radio volume is ramping, or at alarm volume. When this switch is depressed, the volume does not change, and the alarm mode remains unchanged.

If the alarm radio and buzzer are sounding (only in snooze mode) depressing AM/FM switch SW8 silences the buzzer, acknowledges the alarm by disabling the time-out and selects the radio while the alarm mode remains unchanged.

Depressing snooze/sleep switch SW3 when the radio or buzzer alarm sounds silences the alarm. After a snooze interval of ten minutes the alarm sounds again, the alarm time-outs are reset and begin counting when the alarm sounds again. This cycle may be repeated indefinitely.

When alarming in the radio and buzzer mode, the buzzer only sounds. The first depression of snooze/sleep switch SW3 silences the buzzer, and ramps up the radio. After ten minutes the buzzer sounds again. Radio volume does not change, but buzzer volume is added. Alarm time-outs are reset and begin counting when the buzzer sounds again. This cycle may be repeated indefinitely. Once the buzzer has been silenced, a second depression of snooze/sleep switch SW3 silences the radio. Ten minutes after the initial alarm, the buzzer sounds again, the alarm time-outs are reset and begin counting when the alarm sounds again. This cycle may be repeated indefinitely.

When the alarm is not sounding or snoozing, the first depression of snooze/sleep switch SW3 turns the unit on if it was off, and the last source is recalled (AM/FM/AUX). If the tuner is selected, the last band heard and last station on that band heard is selected. If this station is a preset, the appropriate preset indicator is illuminated on display 38. This switch depression engages auto-off function with initial off delay of 75 minutes, illuminates the sleep indicator on display 38, and the time remaining before shut down is displayed for three seconds with a colon followed by two digits with the alarm mode and AM/PM indicator on display 38 extinguished during the three-second display of the time remaining. An additional momentary depression of the snooze/sleep switch SW3 causes display of the time remaining before shutdown. A press-and-hold of this switch causes a display of time remaining before shutdown on display 38, a countdown of time remaining in increments of 60, 45, 30, 15, 10 and 5 to selectively reduce the off delay interval. If the user adjusts the time to 0, the sleep function is disabled, and the unit returns to its previous state. After release of snooze/sleep switch SW3, there is a three-second display of time remaining to shut down, and then a return of the time display indication on display 38. The volume setting function of switch SW4 operates whether the unit is off or on and increments the volume of the current source, tuner or AUX.

A momentary depression of switch SW4 illuminates the volume indicator on display 38, extinguishes the alarm mode, colon, source, preset and AM/PM indicators on display 38, displays the current volume setting for 250 msec in the two digits to the right of the colon, increments the volume setting by one unit, displays the new volume setting in the two digits to the right of the colon for three seconds, and then display 38 returns to its previous state. Indicated volume ranges from 00 (mute) to 99 (max) in single-unit increments. A press-and-hold illuminates the volume indicator on display 38, extinguishes the alarm mode, colon, source, preset and AM/PM indicators on display 38, increments the volume setting at a constant rate of ten units per second, and displays the increase in volume setting in the two digits to the right of the colon on display 38.

After releasing volume up switch SW4, the volume setting is displayed for three more seconds. Then the display returns to its previous state. Depressing volume up switch SW4 when the alarm buzzer is sounding, adjusts the buzzer volume. The default value is typically 40 units. The alarm mode remains unchanged. When the alarm radio is sounding, depressing volume up switch SW4 raises the radio alarm volume, and the alarm mode remains unchanged. If no other switch depression causes the alarm to be acknowledged, the alarm will time out as described above in connection with alarm operation.

Depressing volume down switch SW5 produces the same operation described above in connection with depressing volume up switch SW4, but causes a decrease in volume.

Depressing tune up switch SW6 momentarily changes from time display to station display on display 38, extinguishing colon, and AM/PM while displaying the station frequency in the manner described above. The current station is displayed for 250 milliseconds, the station frequency is incremented by one unit, the new station is displayed for three seconds, and the display then returns to its previous state. Pressing and holding tune up switch SW6 changes from time display to station display as described above and seeks above-threshold stations. If switch SW6 has been released, the seek stops at the next above-threshold station. If the switch is still depressed, seeking continues but does not stop at the next station above threshold. With 9 or 10 kHz AM channel spacing and 200 kHz FM channel spacing, end-to-end tuning takes about ten seconds. With 50 kHz FM channel spacing, end-to-end tuning takes about 20 seconds. Depressing the other tune key of switches SW6 and SW7 during a seek halts the seek. Upon reaching the desired station, the station frequency is displayed for three more seconds on display 38, and then the display returns to its previous state.

When the alarm buzzer is sounding, and the tune up switch SW6 is depressed, nothing happens and the alarm mode remains unchanged. When the alarm radio is sounding, the events described above in connection with seeking occur, the alarm is acknowledged by disabling the time-out, the unit is now on and the alarm mode remains unchanged.

When the radio is on, simultaneously depressing tune up and tune down switches SW6 and SW7 changes the display on display 38 from time display to station display extinguishing the colon and AM/PM and displaying the station frequency. If the station is a preset, the preset remains illuminated. Current station remains displayed as long as the switches are depressed and for three seconds after the switches are released. The display then returns to the previous state.

Operating tune down switch SW7 produces the same operation as described above in connection with operating tune up switch SW6, but decrements the station frequency instead of incrementing it.

Depressing each of preset switches 1–6, SW13–SW18 when the unit is off duplicates the function of power switch SW1. If the unit is off or in the auxiliary mode, a depressed preset switch selects the tuner as the source selecting the last band (AM or FM) last heard and the corresponding preset frequency for the particular switch depressed. The time display on display 38 converts to a station display for three seconds of the frequency of the corresponding station. A momentary depression when the radio is on causes tuning of the tuner to the preset station and mutes the tuner. The time display on display 38 converts to a station display for three seconds of the frequency of the selected station. When the preset switch is released, the corresponding preset indicator is illuminated on display 38.

Pressing and holding a preset switch when the radio is on enables mute drive 43 to mute the audio. After ½ second, the corresponding preset indicator on display 38 is illuminated. The time display converts to a station display until three seconds after the preset switch is released. The current tuner frequency is maintained, and this frequency is loaded into the memory of microprocessor 32 for the depressed preset switch. After the hold-down period, the corresponding preset indicator light is illuminated to confirm that the station frequency has been stored, the preset indicator is extinguished, and an audible beep tone emitted to furnish audible confirmation of this storing.

If the alarm buzzer is sounding, depression of the preset key silences the buzzer, selects the radio with the band last heard selected and tuned to the station associated with the preset key depressed. The alarm is acknowledged by disabling the time-out, the unit is then on, and the alarm mode remains unchanged. If the alarm radio is sounding, the tuner is tuned to the station corresponding to the depressed preset switch, the alarm mode remains unchanged and the alarm is acknowledged by disabling the time-out.

While clock set switch SW10 is depressed, tune up and tune down switches SW6 and SW7 function to adjust the current time displayed by display 38. A momentary depression of tune up switch SW6 or tune down switch SW7 causes a one-minute increment or decrement, respectively, in the displayed time. A press-and-hold of either of these switches increments or decrements the time setting for three seconds at eight minutes per second, and for the remainder of the hold-down at 60 minutes per second. With clock switch SW10 depressed, pressing power switch SW1 converts the display to 24-hour display and extinguishes the AM/PM indicator. With clock set switch SW10 depressed, depressing volume up and volume down switches SW4 and SW5 adjusts the nighttime dim level setting to be brighter and dimmer, respectively.

Depressing alarm set switch SW11 causes display 38 to indicate the alarm time for the Alarm 1 mode and illuminate the alarm indicator along with the radio and buzzer icons if activated. If an alarm station has been set, the AM or FM and preset indicators and the set preset number are also illuminated on display 38. All other display elements are extinguished.

With alarm set switch SW11 depressed, a momentary depression of the tune up or tune down switches SW6 or SW7 causes a one-minute increment or decrement, respectively, in the displayed alarm time-setting. Then pressing and holding one of these keys increment or decrements the displayed alarm time-setting for three seconds at eight minutes per second and for the remainder of the hold-down at 60 minutes per second.

With alarm set switch SW11 depressed, depressing a preset switch stores the corresponding preset station for the current band as the alarm station, illuminating the corresponding AM/FM and preset indicators and preset number until alarm set switch SW11 is released. The selected station frequency is displayed in place of the alarm time for the longer of 500 msec or the duration of the preset switch hold-down. Additional depressions of the same preset switch toggle the alarm station from preset to no preset station and back. Depression of the AM/FM key toggles the band from which the preset keys can select. The appropriate AM or FM indicator is illuminated on display 38 until alarm set switch SW11 is released.

When alarm switch SW11 is held depressed and switch SW12 is tapped, the Alarm 2 set mode is selected, causing the Alarm 2 icon to flash on display 38. Operation of alarm setting in the Alarm 2 mode is the same as that described in connection with the operations described above for the Alarm 1 mode when alarm set switch SW11 is depressed. When in the Alarm 2 mode with switch SW11 depressed, tapping switch SW12 again exits the Alarm 2 mode, and the Alarm 2 icon on display 38 stops flashing. The unit then also exits the Alarm 2 state by timing out.

When the alarm set switch SW11 is released, the display reverts to the current time, the alarm indicator on display 38 is extinguished, and the alarm set and alarm mode keys default to Alarm 1 control after a three-second time out.

When the alarm is not sounding, each depression of alarm mode switch SW12 sequences the alarm conditions through the following alarm options. (1) The alarm is disabled, the radio and buzzer indicators on display 38 are extinguished, and the alarm station is cleared. (2) The alarm is enabled in the radio mode. The radio indicator on display 38 is illuminated. (3) The alarm is enabled in the buzzer mode. The buzzer indicator on display 38 is illuminated, and the radio indicator is extinguished. (4) The alarm is enabled in the radio/buzzer mode. The radio and buzzer indicators on display 38 are illuminated.

The alarm cannot be enabled to play the source at auxiliary input 13. The alarm mode switch SW12 operates whether power is on or off. When the alarm is sounding, a depression of alarm mode switch SW12 silences the alarm and resets the alarm mode to off.

Depressing sleep switch SW3 ramps down the volume 6 volume units corresponding roughly to a 6 dB volume level drop. After the sleep time-out, the volume setting reverts to the previous non-sleep setting. At shutoff the volume ramps down to silence in a ten-second period. The alarm overrides the sleep mode.

The brightness of display 38 automatically dims in low ambient light in response to a photocell day/night sensor, typically photodiode Q303 in FIG. 5. The day display brightness will be full brightness. The brightness setting for the dimmed night display can be adjusted by pressing and holding clock switch SW10 and pressing volume up switch SW4 for a brighter setting and volume down switch SW5 for a dimmer setting. Upon activation of the dimming setting mode, display 38 displays the night setting to allow the user to view the effect of the adjustment. The unit will then display the dimmed display mode for ten seconds after the user has released either one or both of clock switch SW10 and a volume up or volume down switch SW4 or SW5 after which the display will revert to the normal mode. In the exemplary embodiment, the display dimming is not proportional to ambient light level. The brightness toggles between full brightness in day conditions to the selected value in night conditions.

Connection of an external device to the variable outputs 16 enables mute drive 42 to break the audio input circuit to power amplifiers 21 and 24 while making no other change in operating characteristics.

The alarm indicator on display 38 flashes one second on, one second off, until the alarm is acknowledged by a press of power switch SW1, one of the preset switches SW13–SW18, AM/FM switch SW8, auxiliary switch SW9, alarm switch SW11 or alarm mode switch SW12, or the alarm time out is exceeded. When the alarm sounds in the radio mode, the radio comes on, the time display does not convert to a station display, the default alarm station is that station last heard on the last band heard, the tuner selects the alarm station, either preselected or default. If the alarm station is a preset, the appropriate preset indicator is illuminated. The radio volume ramps from silence to preset volume in ten seconds. In the buzzer mode, the buzzer sounds, the buzzer volume ramps from silence to full preselected or default volume in ten seconds. The buzzer volume is user adjustable with a default of about 40 in the radio/buzzer mode. For alarm shutoff when the radio only is sounding, the radio is silenced by depressing one of power switch SW1, alarm mode switch SW12 or auxiliary switch SW9. Depressing the power and auxiliary switches SW1 and SW9 leaves the alarm mode unchanged. Depressing alarm mode switch SW12 resets the alarm mode to off. The radio continues to play when any of the preset, tuning, AM/FM, volume, alarm and clock set switches are depressed. The radio is silenced for ten minutes when snooze/sleep switch SW3 is depressed.

When the buzzer is sounding, the buzzer is silenced by depressing any of power switch SW1, the preset switches SW13–SW18, AM/FM switch SW8, auxiliary switch SW9 and alarm-mode switch SW12. Depressing the latter resets the alarm mode to off, while depressing any of the other switches leaves the alarm mode unchanged. The buzzer continues to sound, and the alarm mode is unchanged by depressing any of the tuning, alarm and clock-set switches. The buzzer is silenced for ten minutes when snooze/sleep switch SW3 is depressed.

In the snooze mode when radio and buzzer are sounding, the radio and buzzer are silenced by pressing power switch SW1, alarm mode switch SW12 and auxiliary switch SW9. Depressing power switch SW1 and auxiliary SW9 leaves the alarm mode unchanged. Depressing alarm mode switch SW12 resets the alarm mode to off. The radio and buzzer continue to sound and the alarm mode is unchanged by depressing tuning, volume, alarm and clock-set switches. The buzzer is silenced for ten minutes and the radio continues to play when snooze/sleep switch SW3 is depressed. A second depression of the latter switch silences the radio for ten minutes or the balance of the snooze time-out established by the first snooze key press. In buzzer mode, the buzzer shuts off after 30 minutes. In the radio/buzzer mode, the buzzer shuts off after 30 minutes, and the radio shuts off after 60 minutes. The alarm icon on display 38 stops flashing when the alarm times out.

During the sleep countdown when the alarm time is reached, the alarm time has priority. In the radio mode, the radio shuts off after 60 minutes. The station that was on remains on. There is no change to the default preset station. In the buzzer mode, the radio is muted and the buzzer sounds. If the alarm is not otherwise acknowledged, the unit then turns off after 30 minutes.

When the radio is on and the alarm time is reached in the radio mode, the alarm is ignored. The radio remains on the station that was on. There is no change to the default preset station. The alarm mode remains unchanged. In the buzzer or radio/buzzer mode, the radio is muted, and the buzzer sounds. If the alarm is not otherwise acknowledged, the unit then turns off after 30 minutes.

When the unit is in the auxiliary mode when the alarm time is reached, in the radio mode, the auxiliary input cannot be used as a sound source for the alarm, the tuner is selected and tuned to the stored or default alarm station. If the station is a preset, the corresponding preset indicator is illuminated on display 38. If the alarm is not otherwise acknowledged, the unit then turns off after 60 minutes.

In the buzzer mode, the auxiliary source is muted, and the buzzer sounds. If the alarm is not otherwise acknowledged, the unit turns off after 30 minutes.

In the radio/buzzer mode, the buzzer sounds with volume ramp up. If the alarm is not otherwise acknowledged, the buzzer shuts off after 30 minutes.

For Alarm 1–2 priority, the alarm sounds at the times and modes set so that the alarm which is set earliest sounds first. After sounding, the alarm operation continues according to the above rules, for the mode set, until the alarm is cancelled or the later alarm sounds. At which time the earlier alarm is cancelled and operation follows the rules for the mode set for the later alarm.

In the battery backup mode, when the unit is running on batteries and there is no A.C. power, the volume is set to 0. If the unit is not in the alarm mode when A.C. power returns, the unit should be in the off state, and the display should not flash. If the unit is in the alarm mode when the A.C. power resumes, the alarm should sound either radio or buzzer. If the alarm time occurs during battery backup mode, either radio or buzzer, the backup buzzer should alarm.

There is attached as Appendix A a listing of steps in a program in the exemplary embodiment of the invention used in microprocessor 32 for providing properties described above.

Other embodiments are within the claims.

What is claimed is:

1. A radio receiver comprising, a radio tuner tunable to a station frequency having a radio frequency input and an audio output for providing a radio audio signal, an audio signal amplifying system having an audio input and an electroacoustical transducing output for providing a transduced audio signal characterized by a volume level, a volume controller coupled to said radio tuner and said audio amplifying system for setting said volume level, a visible display that displays decimal numbers in a common set of digit locations representative of only one of station frequency, volume level and time, during mutually exclusive time intervals, an array of controls, a microprocessor coupled to said radio tuner, said volume controller, said display and said array of controls, said microprocessor constructed and arranged to respond to actuation of said controls to cause said radio tuner to be tuned to a selected station frequency, cause said visible display common set of digit locations to display the selected station frequency to which said radio tuner is tuned for a predetermined station display time interval, cause said volume controller to set said volume level and cause said display common set of digit locations to display a quantity representative of said volume level for a predetermined volume level display time interval and further constructed and arranged to respond to actuation of said controls to initially set said volume level to zero when said receiver turns on and gradually increasing said volume level to a predetermined volume setting during said volume level display time interval.

2. A radio receiver in accordance with claim 1 wherein said microprocessor is further constructed and arranged to cause said display common set of digit locations to normally display time of day and respond to selected ones of said controls to provide alarm operation causing said radio tuner audio output to provide said radio audio signal at a predetermined time determined in accordance with actuation of preselected ones of said controls.

3. A radio receiver in accordance with claim 2 wherein said microprocessor is further constructed and arranged to respond to actuation of preselected ones of said controls to establish said predetermined volume setting when said radio receiver is off.

4. A radio receiver in accordance with claim 1 and further comprising, a source of an audible alarm tone, wherein said microprocessor is further constructed and arranged to cause said display to normally display time of day and respond to selected ones of said controls to provide alarm operation causing said alarm tone to sound as a transduced audio signal at said electroacoustical transducing output at a predetermined time determined in accordance with actuation of said preselected ones of said controls while initially setting the sound volume level of said tone to zero at said predetermined time and gradually increasing the sound level of said alarm tone to a predetermined value.

5. A radio receiver in accordance with claim 3 wherein said microprocessor is further constructed and arranged to establish said predetermined value of said alarm tone when said radio receiver is off.

6. A radio receiver in accordance with claim 1 and further comprising, an auxiliary input for providing an auxiliary audio signal characterized by an auxiliary volume level, a source selector, said microprocessor further constructed and arranged to respond to actuation of said controls to cause said source selector to couple a selected one of said radio tuner audio output and said auxiliary input to said audio signal amplifying system audio input, said microprocessor also constructed and arranged to cause said volume controller to set said volume level to said auxiliary volume level and cause said display common set of digit locations to display a quantity representative of said auxiliary volume level when said auxiliary input is coupled to said audio signal amplifying system audio input;

the audio signal on the radio tuner audio output characterized by radio volume level, said microprocessor constructed and arranged to retain predetermined radio volume and predetermined auxiliary volume signals representative of the last predetermined radio and auxiliary volume level settings for both said audio output and said auxiliary input when each of said audio output and said auxiliary input was last selected by said selector source.

7. A radio receiver in accordance with claim 1 located in a region wherein said visible display is characterized by brightness and further comprising a photodetector constructed and arranged to provide an ambient light level signal representative of ambient light level in said region, said photodetector being coupled to said microprocessor, said microprocessor being further constructed and arranged to respond to actuation of selected ones of said controls to establish a predetermined dim light level for said display when the ambient level is less than a predetermined value and reduce the brightness of said display to said predetermined dim light level when the ambient light level is less than said predetermined value.

8. A radio receiver comprising:

a radio tuner tunable to a station frequency having a radio frequency input and an audio output for providing a radio audio signal, an audio signal amplifying system having an audio input and an electroacoustical transducing output for providing a transduced audio signal characterized by a volume level, a volume controller coupled to said radio tuner and said audio amplifying system for setting said volume level, a visible display that displays decimal numbers in a common set of digit locations representative of only one of station frequency, volume level and time, during mutually exclusive time intervals, an array of controls, a microprocessor coupled to said radio tuner, said volume controller, said display and said array of controls, said microprocessor constructed and arranged to respond to actuation of said controls to cause said radio tuner to be tuned to a selected station frequency, cause said visible display common set of digit locations to display the selected station frequency to which said radio tuner is tuned for a predetermined station display time interval, cause said volume controller to set said volume level and cause said display common set of digit locations to display a quantity representative of said volume level for a predetermined volume level display time interval and further constructed and arranged to respond to actuation of said controls to initially set said volume level to zero when said receiver turns on and gradually increasing said volume level to a predetermined volume setting during said volume level display time interval, wherein said microprocessor is further constructed and arranged to cause said display common set of digit locations to normally display time of day and respond to selected ones of said controls to provide alarm operation causing said radio tuner audio output to provide said radio audio signal at a predetermined time determined in accordance with actuation of preselected ones of said controls, and further comprising a source of an alarm tone wherein said microprocessor is further constructed and arranged to cause said display to normally display time of day and respond to said selected one of said controls to provide said alarm operation causing said alarm tone to sound at said predetermined time determined in accordance with actuation of said preselected ones of said controls, respond to tapping a predetermined snooze one of said controls to cause said alarm tone to cease for a predetermined snooze-interval while causing said audio signal amplifying system to continue transducing an audio signal coupled from said radio tuner audio output, and responding to tapping said snooze control twice to cause both said alarm tone and said audio signal to terminate for said snooze interval.

9. Sound reproducing apparatus comprising, an audio signal amplifying system having an audio input for receiving an audio signal and an electroacoustical transducing output for providing a sound level, a volume controller coupled to said audio amplifying system, an array of controls, a microprocessor coupled to said volume controller and said array of controls, said microprocessor constructed and arranged to respond to actuation of said controls to cause said volume controller to set said sound level when said audio signal is present on said audio input while initially setting said sound level to zero when said sound reproducing apparatus turns on and gradually increasing said sound level to a predetermined value and further constructed and arranged to respond to actuation of preselected ones of said controls to establish said predetermined value when said audio input is free of said audio signal.

10. Sound reproducing apparatus comprising, an audio signal amplifying system having an audio input for receiving an audio signal and an electroacoustical transducing output for providing a sound level, a volume controller coupled to said audio amplifying system, an array of controls, a main input, an auxiliary input, a source selector, a microprocessor coupled to said volume controller, said source selector and said array of controls, said microprocessor constructed and arranged to respond to actuation of said controls to set said sound level and cause said source selector to selectively couple a selected one of said main input and said auxiliary input to said audio input while initially setting said sound level to zero when said sound reproducing apparatus turns on and gradually increasing said sound level to a main input predetermined value associated with said main input and an auxiliary input predetermined value associated with said auxiliary input, said microprocessor being further constructed and arranged to retain main input and auxiliary input signals representative of the last main input and auxiliary input predetermined values for both said main input and said auxiliary input respectively when each of said main input and said auxiliary input was last selected by said source selector.

* * * * *

UNITED STATES PATENT AND TRADEMARK OFFICE
CERTIFICATE OF CORRECTION

PATENT NO. : 5,483,689
DATED : Jan. 9, 1996
INVENTOR(S) : John J. O'Donnell, Jr. et al.

It is certified that error appears in the above-identified patent and that said Letters Patent is hereby corrected as shown below:

Item [56],
Cover page, under "References Cited", "3,960,798 8/1976" should read --3,900,798 8/1975--.

Column 10, line 50, "claim 3" should read --claim 4--.

Column 11, line 4, ";" should read --,--.

Column 11, line 28, ":" should read --,--.

Column 12, line 14, after "snooze" the "-" should be deleted.

Signed and Sealed this

Fourteenth Day of January, 1997

*Attest:*

BRUCE LEHMAN

*Attesting Officer*  *Commissioner of Patents and Trademarks*